United States Patent
Matsumoto et al.

(10) Patent No.: US 9,627,237 B2
(45) Date of Patent: Apr. 18, 2017

(54) APPARATUS, METHOD AND NON-TRANSITORY STORAGE MEDIUM FOR ACCOMMODATING AND PROCESSING A SUBSTRATE

(71) Applicant: TOKYO ELECTRON LIMITED, Tokyo (JP)

(72) Inventors: Akihiro Matsumoto, Koshi (JP); Michiaki Matsushita, Koshi (JP); Satoru Shinto, Koshi (JP); Kazunori Kuratomi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 549 days.

(21) Appl. No.: 14/149,395

(22) Filed: Jan. 7, 2014

(65) Prior Publication Data
US 2014/0199140 A1 Jul. 17, 2014

(30) Foreign Application Priority Data
Jan. 15, 2013 (JP) .................................. 2013-004382

(51) Int. Cl.
*H01L 21/677* (2006.01)
*H01L 21/67* (2006.01)

(52) U.S. Cl.
CPC .. *H01L 21/67259* (2013.01); *H01L 21/67772* (2013.01)

(58) Field of Classification Search
CPC ................. H01L 21/67259; H01L 21/67772

USPC ......................................................... 414/217
See application file for complete search history.

(56) References Cited

U.S. PATENT DOCUMENTS

| 6,945,258 B2 * | 9/2005 | Itou | H01L 21/67178 118/668 |
| 2001/0055522 A1 * | 12/2001 | Kaneda | H01L 21/67772 414/217 |
| 2010/0111648 A1 * | 5/2010 | Tamura | H01L 21/67248 414/217 |
| 2011/0158774 A1 * | 6/2011 | Yamaguchi | H01L 21/67265 414/222.02 |
| 2014/0305540 A1 * | 10/2014 | Oyama | H01L 21/67389 141/4 |

FOREIGN PATENT DOCUMENTS

JP 2001-358197 A 12/2001

* cited by examiner

*Primary Examiner* — Jonathan Snelting
(74) *Attorney, Agent, or Firm* — Nath, Goldberg & Meyer; Jerald L. Meyer

(57) ABSTRACT

A substrate accommodating and processing apparatus is provided with a cassette mounting table, a processing part, a substrate transfer mechanism, a partition wall, a cassette stage, and a lid attaching/detaching mechanism. The lid attaching/detaching mechanism is provided with a key configured to be engaged with a key hole installed in the lid, and configured to switch a latch between locking and unlocking positions. The mechanism is also provided with a lid abnormality detecting sensor, a lid attaching/detaching mechanism closing sensor, a lid attaching/detaching mechanism opening sensor, a pressure sensor and a control part.

10 Claims, 18 Drawing Sheets

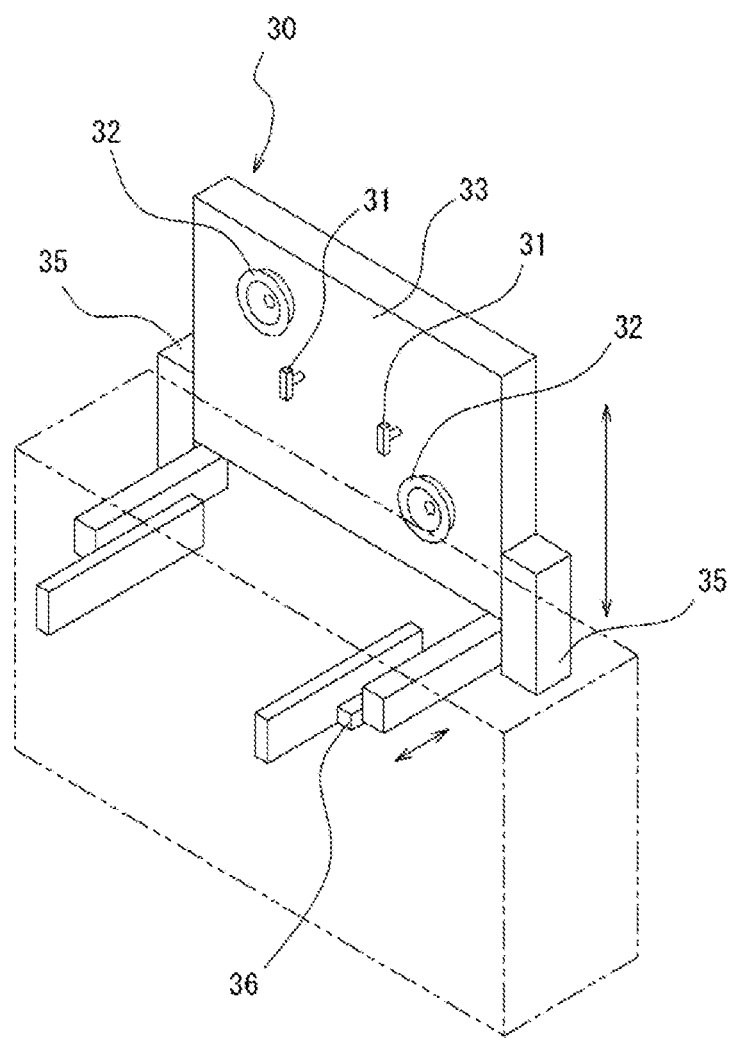

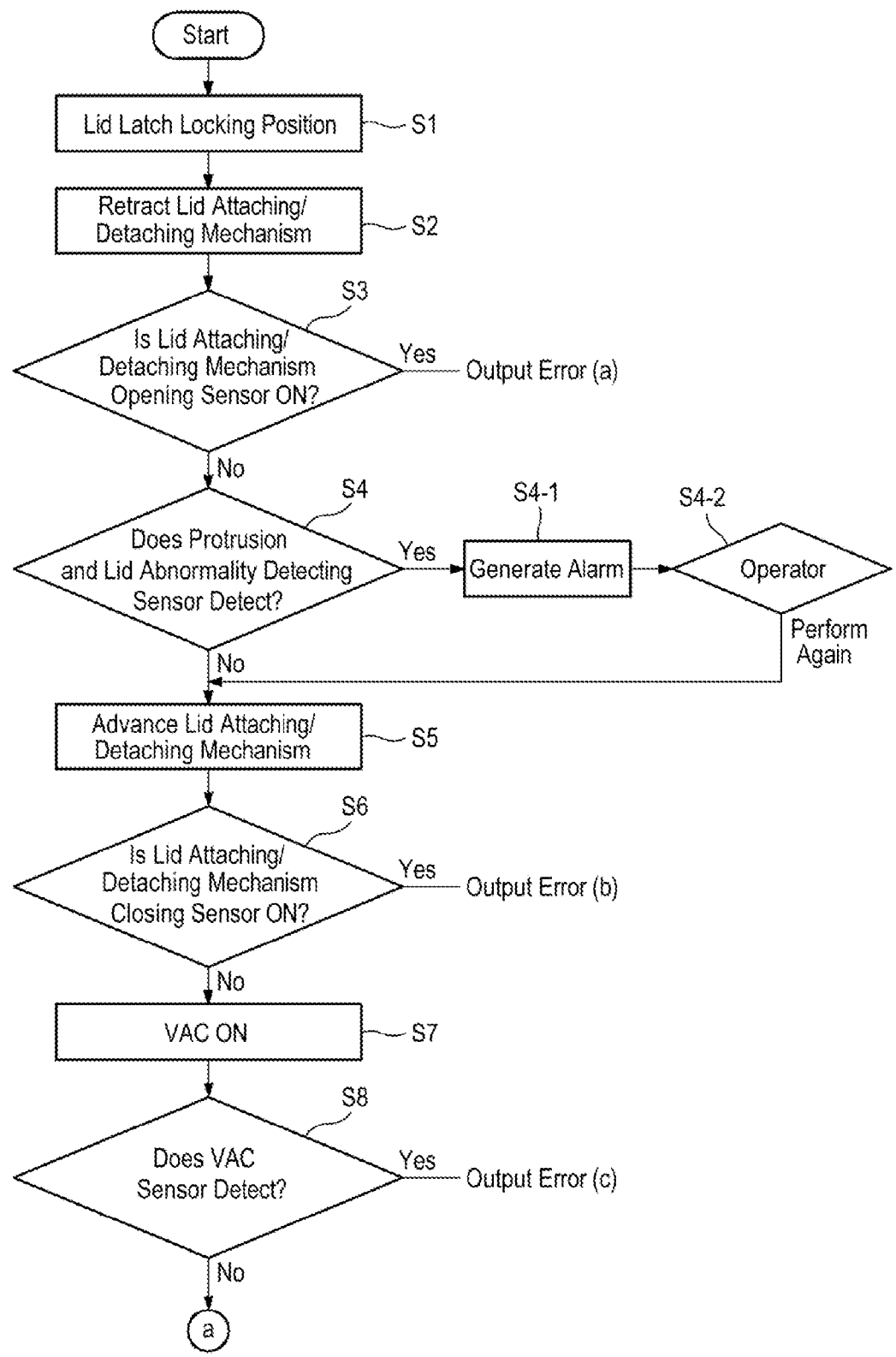

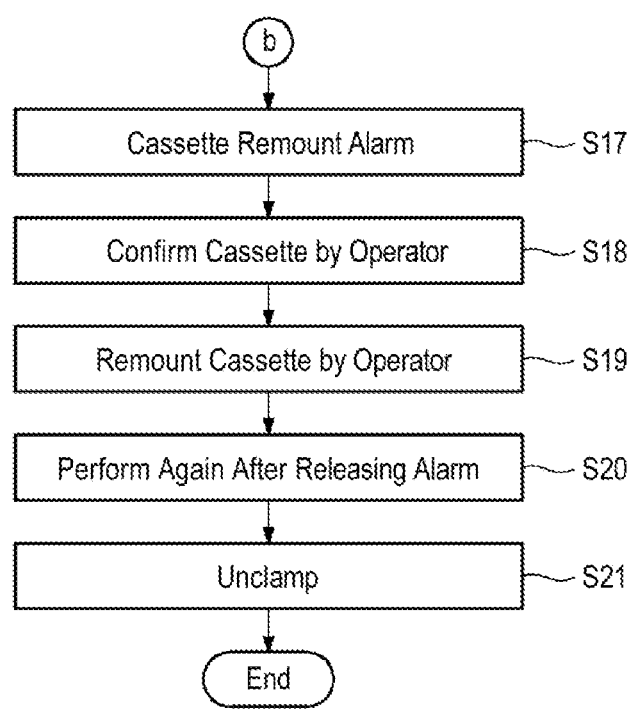

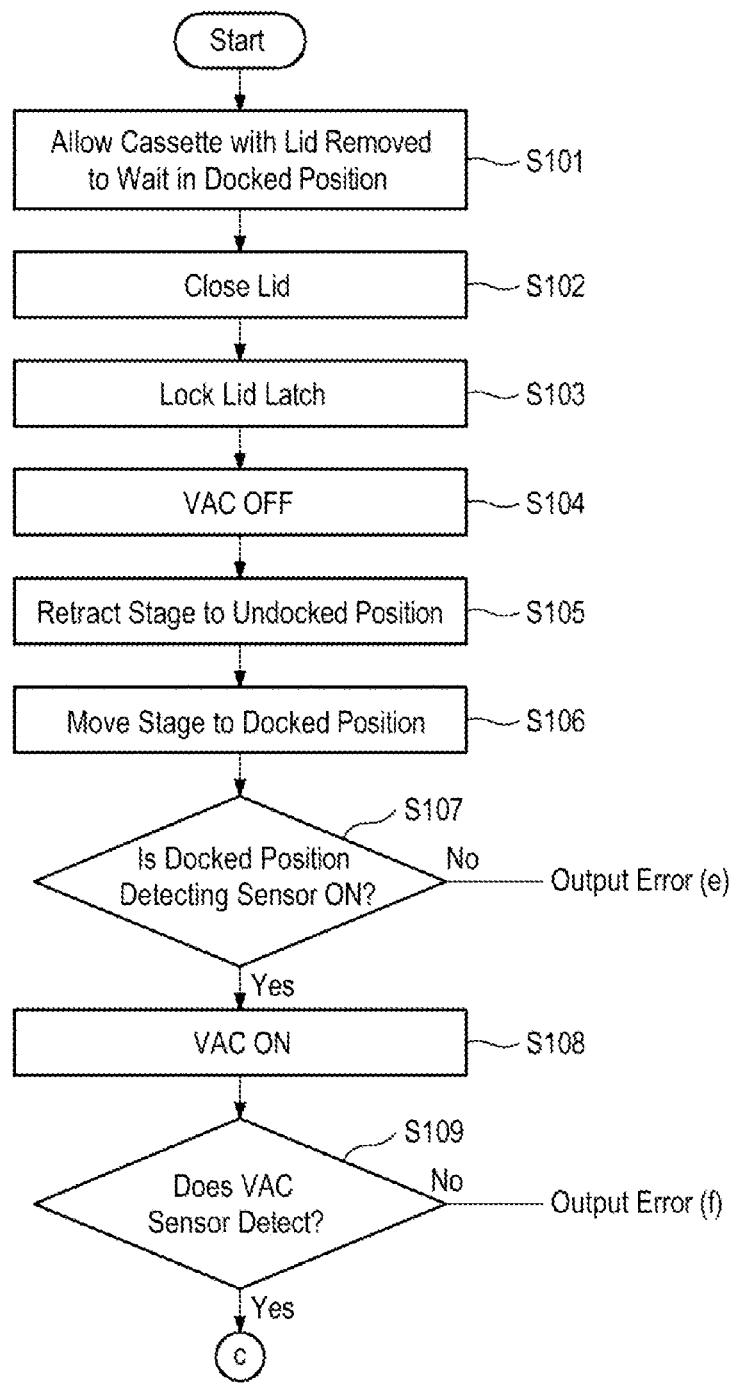

APPARATUS, METHOD AND NON-TRANSITORY STORAGE MEDIUM FOR ACCOMMODATING AND PROCESSING A SUBSTRATE

CROSS-REFERENCE TO RELATED APPLICATION

This application claims the benefit of Japanese Patent Application No. 2013-004382, filed on Jan. 15, 2013, in the Japan Patent Office, the disclosure of which is incorporated herein in its entirety by reference.

TECHNICAL FIELD

The present disclosure relates to an apparatus, method and non-transitory storage medium for accommodating and processing a substrate, configured to perform the safe transfer of a substrate after being processed.

BACKGROUND

Generally, in a semiconductor manufacturing process, a circuit pattern is formed, for example, by applying photoresist onto a substrate such as a semiconductor wafer, exposing and developing the resist film according to a predetermined circuit pattern. In a photolithography process as the semiconductor manufacturing process, a processing system having an exposure apparatus connected to a coating and development processing apparatus is generally used.

In the processing system, a substrate is taken out one by one from a cassette transferred by an overhead hoist transfer (OHT) cassette transfer mechanism, and is processed in a processing unit of a processing part, and then, the substrate after being processed is returned into the cassette. In such a case, a highly airtight cassette referred to as a FOUP (front opening universal pod) is used, a cassette main body is provided with an opening for charging and discharging a substrate, and the opening is provided with a lid that can be locked by a latch mechanism.

In the processing system, the cassette transferred by the cassette transfer mechanism is mounted onto a cassette mounting table installed in the processing system, and the lid of the cassette is unlocked and opened by a lid attaching/detaching mechanism having a key installed in the processing system. In a state where the lid is opened, a substrate is taken out from the cassette with the lid opened by a substrate transfer mechanism disposed in the processing system and is transferred to the processing unit of the processing part, and processing steps such as photoresist coating and developing is performed in the processing unit. Thereafter, the processed substrate is returned to the cassette by the substrate transfer mechanism. Then, the lid is closed and locked by the lid attaching/detaching mechanism. The cassette with the lid closed is unloaded from the cassette mounting table by the cassette transfer mechanism and is transferred to a transfer path, a cassette receiving part or the like that is formed in an outer upper portion of the processing system.

However, if the lid is insufficiently locked after the processed substrate is accommodated into the cassette, there is a risk that vibration or the like during the transfer of the cassette causes the lid to be opened, causing the substrate in the cassette to fall, or the lid to be partially opened, causing the substrate in the cassette to protrude to the outside.

SUMMARY

Some embodiments of the present disclosure provide an apparatus, method and non-transitory storage medium for accommodating and processing a substrate, which includes a function of confirming that a lid is locked after a processed substrate is accommodated, and thereby capable of promoting the safety of transfer of the processed substrate.

According to the embodiment of the present disclosure, provided is a substrate accommodating and processing apparatus, including a cassette mounting table configured to mount a cassette having an opening for charging and discharging a substrate therethrough and a lid attachable to and detachable from the opening, a processing part configured to process the substrate accommodated in the cassette of the cassette mounting table, a substrate transfer mechanism configured to transfer the substrate to the processing part and to return the substrate after being processed to the cassette of the cassette mounting table, a partition wall configured to divide the cassette mounting table and a displacement part of the substrate transfer mechanism from each other and to have an opening larger than the opening of the cassette, a cassette stage configured to be displaced on the cassette mounting table and to be movable forward and rearward to a docked position causing the mounted cassette to be in contact with the opening of the partition wall and an undocked position retracted from the docked position, a lid attaching/detaching mechanism configured to remove the lid from the opening of the cassette and engage the lid to the opening of the cassette via the opening of the partition wall, wherein the lid attaching/detaching mechanism is provided with a key configured to be engaged with a key hole installed in the lid, and configured to switch a latch between locking and unlocking positions, the latch being removed from or caught into the opening of the cassette, and a suction holding member configured to suction-hold and support the lid, a lid abnormality detecting sensor displaced at an edge of the opening of the partition wall to confirm an open/closed state of the lid, a lid attaching/detaching mechanism closing sensor and a lid attaching/detaching mechanism opening sensor respectively configured to detect a lid closing position in which the lid held and supported by the lid attaching/detaching mechanism is engaged and a lid opening position retracted from the lid closing position, a pressure sensor configured to detect a negative pressure allowing the suction holding member to suction-hold and support the lid; and a control part configured to receive detection signals of the lid abnormality detecting sensor, the lid attaching/detaching mechanism closing sensor, the lid attaching/detaching mechanism opening sensor and the pressure sensor and to control operation of moving the lid attaching/detaching mechanism to opening and closing positions, operation of locking and unlocking the key, and operation of moving the cassette mounted onto the cassette stage to the docked position and the undocked position, wherein based on a control signal of the control part, after the processed substrate is accommodated in the cassette and the lid is closed against the opening of the cassette, when the lid attaching/detaching mechanism with the lid not held and supported is retracted from the lid closing position to the lid opening position, the lid attaching/detaching mechanism opening sensor detects the lid opening position of the lid and the lid abnormality detecting sensor detects whether or not there is a lid abnormality to determine an abnormality of the lid closed state.

According to the embodiment of the present disclosure, provided is a substrate accommodating and processing apparatus, including A substrate accommodating and processing apparatus, including a cassette mounting table configured to mount a cassette having an opening for charging and discharging a substrate therethrough and a lid attachable to and detachable from the opening, a processing part configured to process the substrate accommodated in the cassette of the cassette mounting table, a substrate transfer mechanism configured to transfer the substrate to the processing part and to return the substrate after being processed to the cassette of the cassette mounting table, a partition wall configured to divide the cassette mounting table and a displacement part of the substrate transfer mechanism from each other and to have an opening larger than the opening of the cassette, a cassette stage configured to be displaced on the cassette mounting table and to be movable forward and rearward to a docked position causing the mounted cassette to be in contact with the opening of the partition wall and an undocked position retracted from the docked position, a lid attaching/detaching mechanism configured to remove the lid from the opening of the cassette and engage the lid to the opening of the cassette via the opening of the partition wall, wherein the lid attaching/detaching mechanism is provided with a key configured to be engaged with a key hole installed in the lid, and configured to switch a latch between locking and unlocking positions, the latch being removed from or caught in the opening of the cassette, and a suction holding member configured to suction-hold and support the lid, a docked position detecting sensor configured to detect the docked position of the cassette mounted onto the cassette stage; and a control part configured to control operation of moving the lid attaching/detaching mechanism to opening and closing positions, operation of locking and unlocking the key, and operation of moving the cassette mounted onto the cassette stage to the docked position and the undocked position, wherein after the lid of the opening of the cassette having the processed substrate accommodated therein is closed in the docked position and the latch is switched to a locked position, the control part retracts the cassette mounted onto the cassette stage to the undocked position and then advances the cassette mounted onto the cassette stage to the docked position again, thereby confirming whether or not there is a signal of the docked position sensor.

According to the embodiment of the present disclosure, provided is a method of accommodating and processing a substrate using an apparatus of accommodating and processing a substrate, the apparatus including a cassette mounting table configured to mount a cassette having an opening for charging and discharging a substrate therethrough and a lid attachable to and detachable from the opening, a processing part configured to process the substrate accommodated in the cassette of the cassette mounting table, a substrate transfer mechanism configured to transfer the substrate to the processing part and to return the substrate after being processed to the cassette of the cassette mounting table, a partition wall configured to divide the cassette mounting table and a displacement part of the substrate transfer mechanism from each other and to have an opening larger than the opening of the cassette, a cassette stage configured to be displaced on the cassette mounting table and to be movable forward and rearward to a docked position causing the mounted cassette to be in contact with the opening of the partition wall and an undocked position retracted from the docked position, a lid attaching/detaching mechanism configured to remove the lid from the opening of the cassette and engage the lid to the opening of the cassette via the opening of the partition wall, wherein the lid attaching/detaching mechanism is provided with a key configured to be engaged with a key hole installed in the lid, the key switching a latch between locking and unlocking positions, the latch being removable caught in the opening of the cassette, and a suction holding member configured to suction-hold and support the lid, a lid abnormality detecting sensor displaced at an edge of the opening of the partition wall to confirm an open/closed state of the lid, a lid attaching/detaching mechanism closing sensor and a lid attaching/detaching mechanism opening sensor respectively configured to detect a lid closing position in which the lid held and supported by the lid attaching/detaching mechanism is engaged and a lid opening position retracted from the lid closing position, a pressure sensor configured to detect a negative pressure allowing the suction holding member to suction-hold and support the lid, and a control part configured to receive detection signals from the lid abnormality detecting sensor, the lid attaching/detaching mechanism closing sensor, the lid attaching/detaching mechanism opening sensor and the pressure sensor and to control operation of moving the lid attaching/detaching mechanism to opening and closing positions, operation of locking and unlocking the key, and operation of moving the cassette mounted onto the cassette stage to the docked position and the undocked position, the method including closing the lid against the opening of the cassette after the processed substrate is accommodated in the cassette, retracting the lid attaching/detaching mechanism from the lid closing position to the lid opening position in a state where the lid is not held and supported, detecting the lid opening position of the lid attaching/detaching mechanism by the lid attaching/detaching mechanism opening sensor, determining an abnormality of a closing state of the lid by the lid abnormality detecting sensor, moving the lid attaching/detaching mechanism retracted from the lid closing position to the lid closing position again, and engaging the key hole of the lid and the key of the lid attaching/detaching mechanism with each other.

According to the embodiment of the present disclosure, provided is a method of accommodating and processing a substrate using an apparatus of accommodating and processing a substrate, the apparatus including a cassette mounting table configured to mount a cassette having an opening for charging and discharging a substrate therethrough and a lid attachable to and detachable from the opening, a processing part configured to process the substrate accommodated in the cassette of the cassette mounting table, a substrate transfer mechanism configured to transfer the substrate to the processing part and to return the substrate after being processed to the cassette of the cassette mounting table, a partition wall configured to divide the cassette mounting table and a displacement part of the substrate transfer mechanism from each other and to have an opening larger than the opening of the cassette, a cassette stage configured to be displaced on the cassette mounting table and to be movable forward and rearward to a docked position causing the mounted cassette to be in contact with the opening of the partition wall and an undocked position retracted from the docked position, a docked position detecting sensor configured to detect the docked position of the cassette mounted onto the cassette stage, a lid attaching/detaching mechanism configured to remove the lid from the opening of the cassette and engage the lid to the opening of the cassette via the opening of the partition wall, wherein the lid attaching/detaching mechanism is provided with a key configured to be engaged with a key hole installed in the lid, the key switching a latch between locking and unlocking positions, the latch being removable caught in the opening of the cassette, and a suction holding member configured to suction-hold and support the lid, and a control part configured to control operation of moving the lid attaching/detaching mechanism to opening and closing positions, operation of locking and unlocking the key, and operation of moving the cassette mounted onto the cassette stage to the docked position and the undocked position, the method including engaging the key hole of the lid and the key of the lid attaching/detaching mechanism with each other in a state where the cassette is retracted to the undocked position and then moved to the docked position again after the processed substrate is accommodated in the cassette and the lid is closed against the opening of the cassette, based on a control signal from the control part, and confirming whether or not there is a signal from the docked position detecting sensor for detecting the docked position in the engaging the key hole of the lid and the key of the lid attaching/detaching mechanism with each other.

According to the embodiment of the present disclosure, provided is a non-transitory computer-readable storage medium for accommodating and processing a substrate having a software stored therein for executing a control program and used in an apparatus of accommodating and processing a substrate, in which after a substrate taken out from a cassette having an opening for charging and discharging the substrate and a lid attachable to and detachable from the opening is processed in a processing part, the substrate after being processed is accommodated in the cassette, the lid is closed against the opening of the cassette, and the cassette is then transferred by a cassette transfer mechanism, wherein the control program has processes constructed to perform the above methods.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a schematic perspective view showing a lid attaching/detaching mechanism of the present disclosure.

FIG. 9A is a flowchart showing a process from opening to closing the lid in a method of accommodating and processing a substrate of a first embodiment.

FIG. 9C is a flowchart showing a process after the lid abnormality is confirmed in the method of accommodating and processing a substrate of the first embodiment.

FIG. 12A is a flowchart illustrating a process of confirming whether or not there is a lid abnormality in a method of accommodating and processing a substrate of the second embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of the present disclosure will be described with reference to the accompanying drawings. Here, an apparatus of accommodating and processing a substrate according to the present disclosure, which is applied to a processing system having an exposure processing apparatus connected to a coating and development processing apparatus, will be described.

Figure 1:
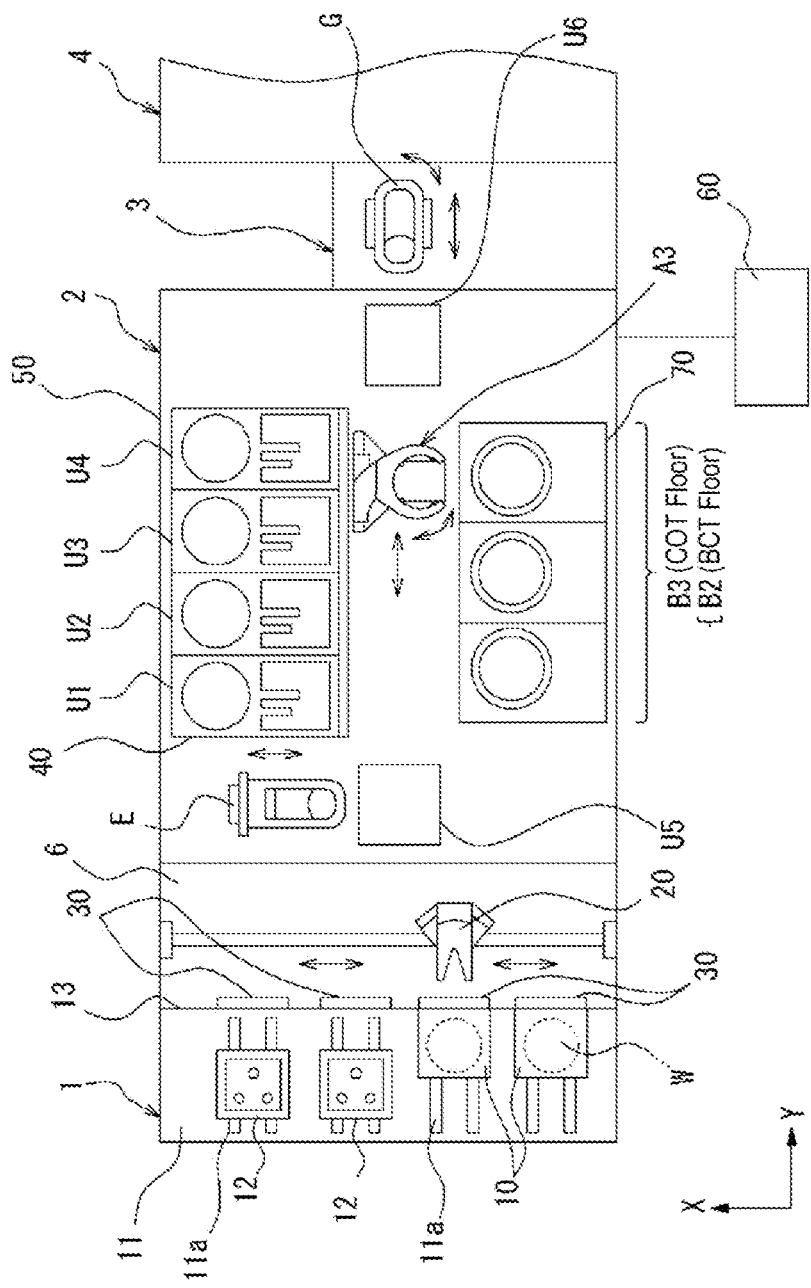
FIG. 1 is a schematic plan view showing an entire processing system having an exposure apparatus connected to a coating and development processing apparatus to which an apparatus of accommodating and processing a substrate according to the present disclosure is applied.
Figure 2:
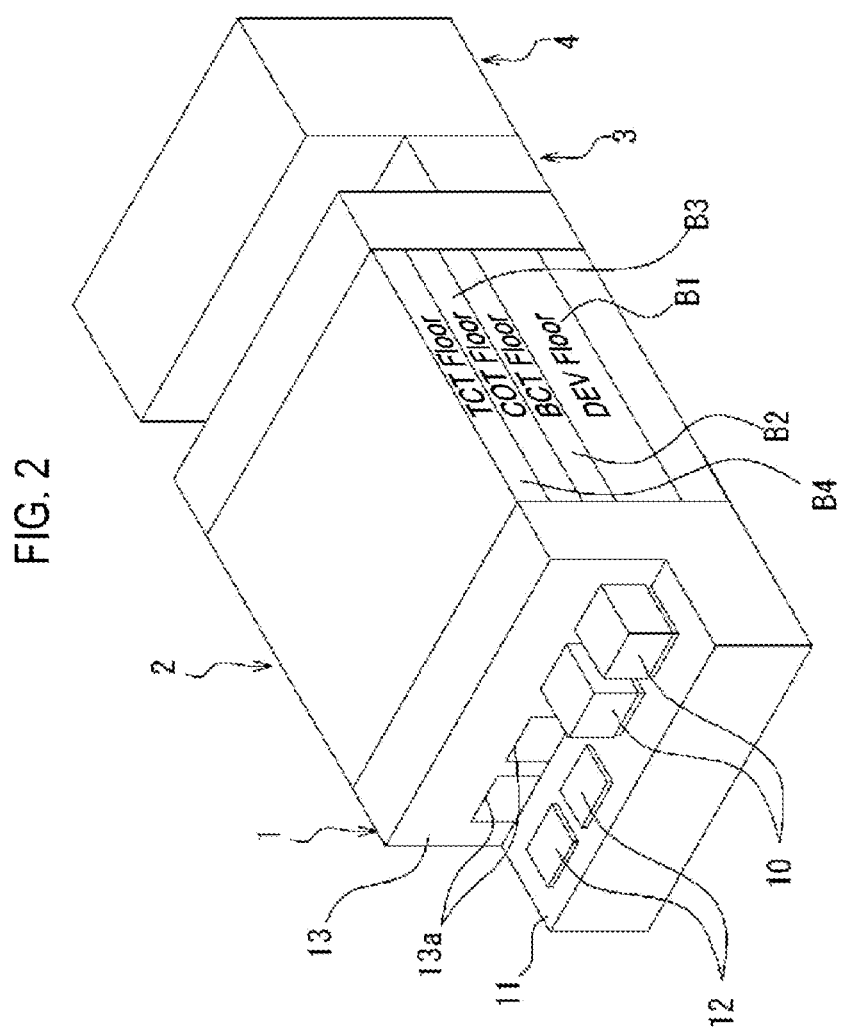
FIG. 2 is a schematic perspective view of the processing system.
Figure 3:
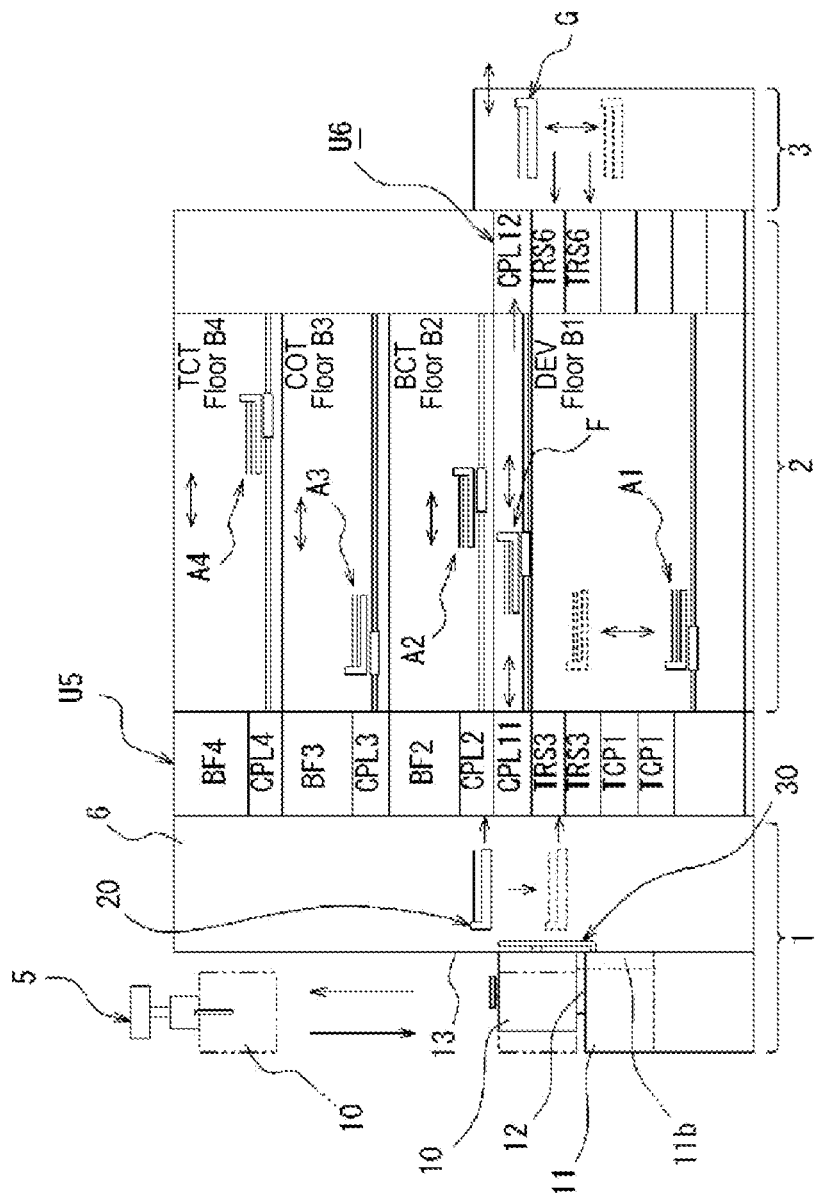
FIG. 3 is a schematic longitudinal sectional view of the processing system.

As shown in FIGS. 1 to 3, a processing system includes a cassette station 1 for loading and unloading cassettes 10, in each of which a plurality of (e.g. 25 sheets) semiconductor wafers W (hereinafter, referred to as wafers W) is air tightly contained as substrates to be processed. The processing system further includes a processing portion 2 for performing processing, such as resist coating and development processing, on a wafer W taken out from the cassette station 1, and an exposure portion 4 for performing liquid immersion exposure on a wafer W in a state where a light-transmitting liquid layer is formed on a surface of the wafer W. An interface portion 3 interconnects the processing portion 2 and the exposure portion 4 to allow for the receiving and delivering of the wafers W. The processing system also includes a cassette transfer mechanism 5 installed at an upper portion of cassette stages 12 to load and unload the cassettes 10 to and from the cassette station 1.

The cassette station 1 is provided with a cassette mounting table 11 on which a plurality of the cassettes 10 may be arranged side by side, and a substrate transfer mechanism 20 which takes out the wafers W from the cassettes 10 and returns processed wafers W to the cassettes 10. The cassettes are mounted on a plurality of cassette stages 12 (e.g., four) disposed on the cassette mounting table 11 and clamped by a clamp mechanism (not shown). A partition wall 13 separates the cassette mounting table 11 and a displacement portion 6 of the substrate transfer mechanism 20 from each other, and has openings 13a, each of which are larger than an opening 10b of each cassette 10 (see FIG. 5).

Each of the cassette stages 12 displaced on the cassette mounting table 11 is mounted to be movable by sliding along guide rails 11a, which are constructed on the cassette mounting table 11 and extend in a Y-axis direction. The cassette stages 12 are each configured to be movable forward and rearward to (i) a docked position in which the mounted cassette 10 is in contact with the opening 13a of the partition wall 13, and (ii) an undocked position in which the cassette 10 is retracted from the opening 13a. Each of the cassette stages 12 has a movable base 12c that is movable by sliding on the guide rails 11a and is movable in the Y-axis direction by a moving mechanism 14 connected to the movable base 12c (see FIG. 4).

Figure 4:
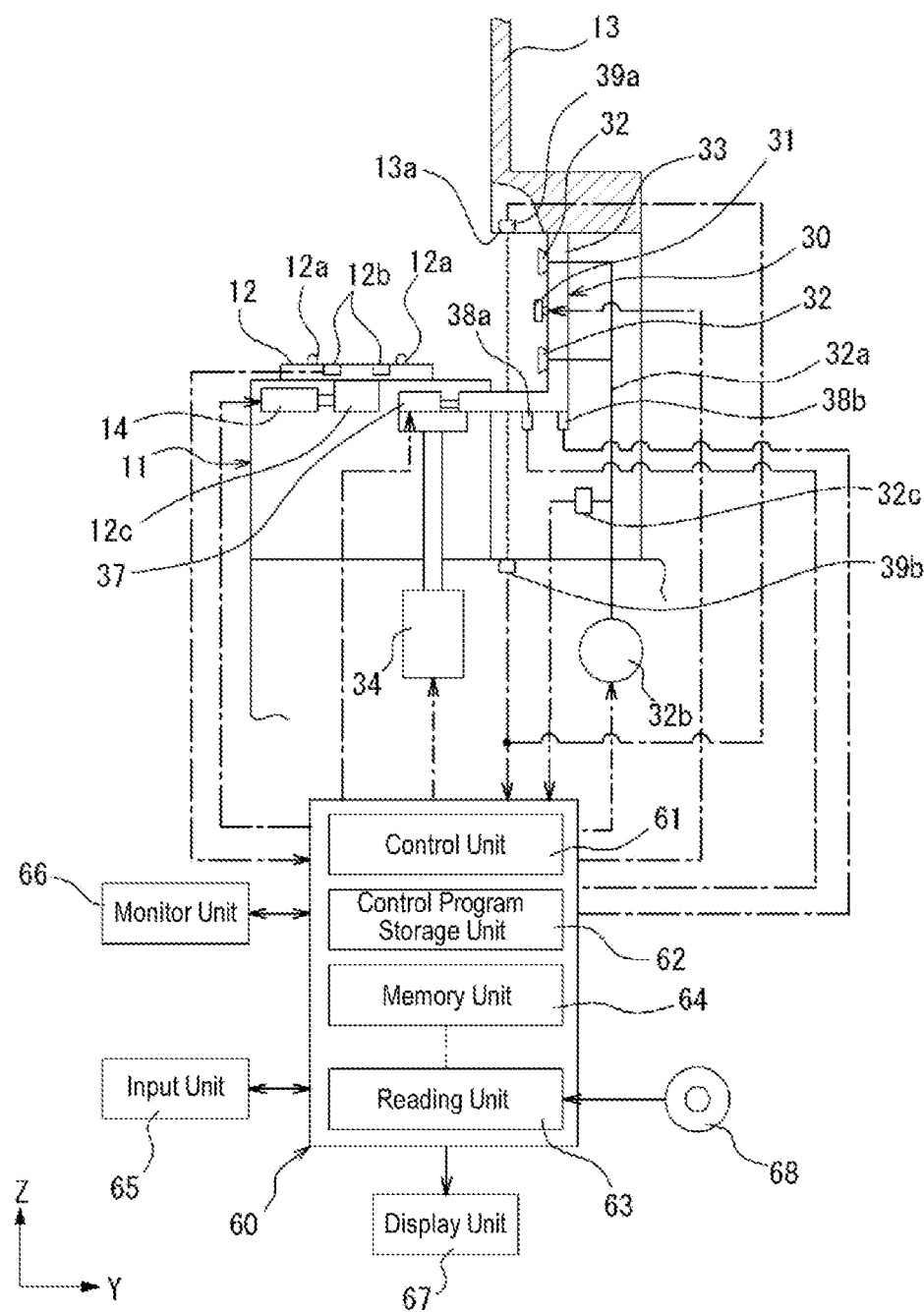
FIG. 4 is a schematic view showing a configuration of a portion of the apparatus of accommodating and processing a substrate according to the present disclosure.

As shown in FIG. 4, positioning pins 12a are installed in the central portion on top of the cassette stage 12, and sensors 12b are displaced in the vicinity of the positioning pins 12a. When the cassette 10 is mounted on the cassette stage 12, the positioning pins 12a are fitted into bottom concave portions (not shown) of the cassette 10, thereby positioning the cassette 10. In addition, when the cassette 10 is mounted onto the cassette stage 12, the sensors 12b detect the cassette 10 and send their detection signals to a control computer 60 as a control part described later. In addition, the cassette stage 12 is provided with a clamp mechanism (not shown), which detachably fixes the cassette 10 when the cassette 10 transferred by the cassette transfer mechanism 5 is mounted on the cassette stage 12.

Figure 5:
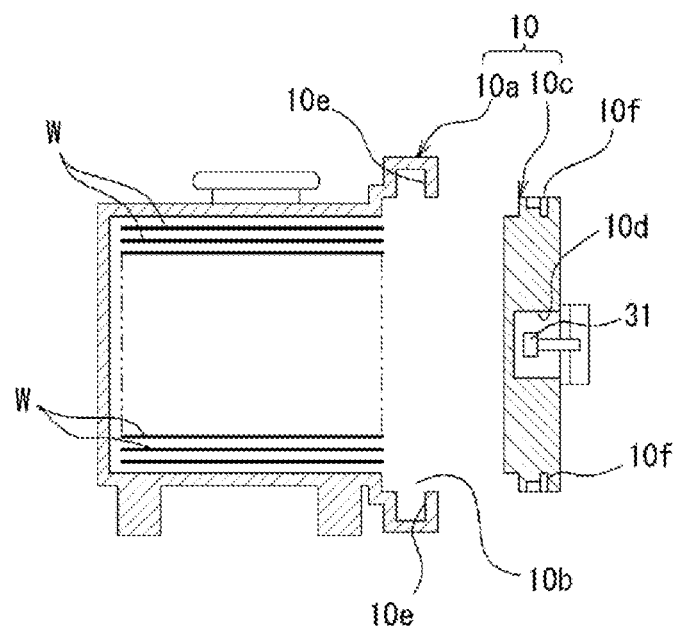
FIG. 5 is a sectional view showing a state where a lid of a cassette is open in the present disclosure.
Figure 6:
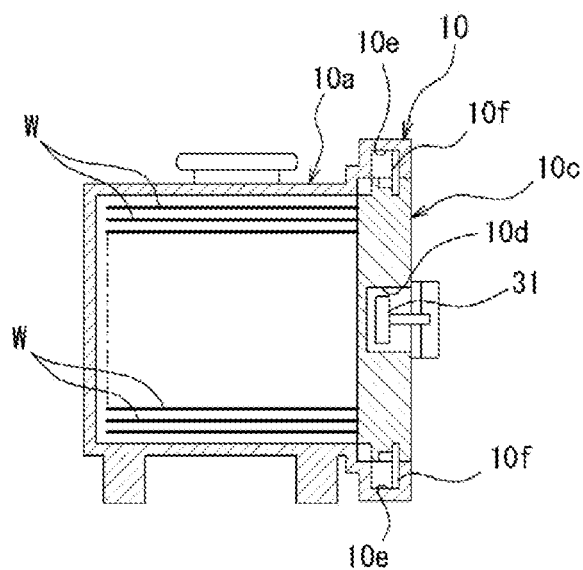
FIG. 6 is a sectional view showing a state where the lid is locked to the cassette in the present disclosure.
Figure 7:
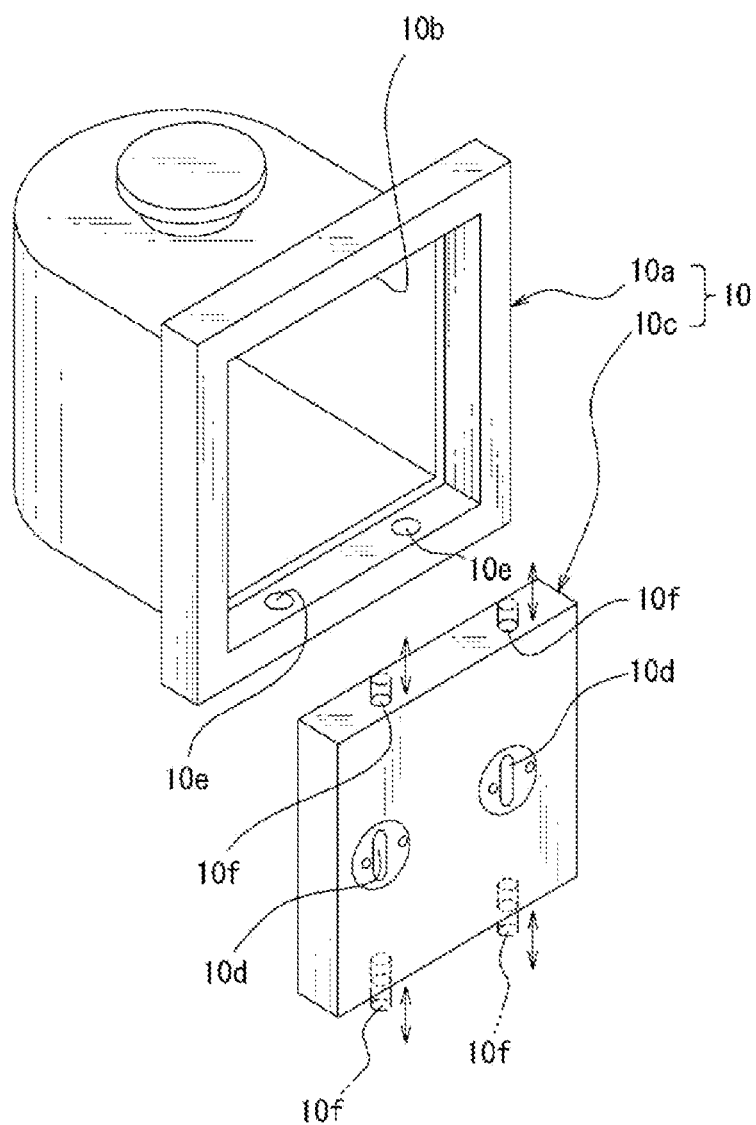
FIG. 7 is a perspective view showing the cassette and the lid of the present disclosure.
Figure 9B:
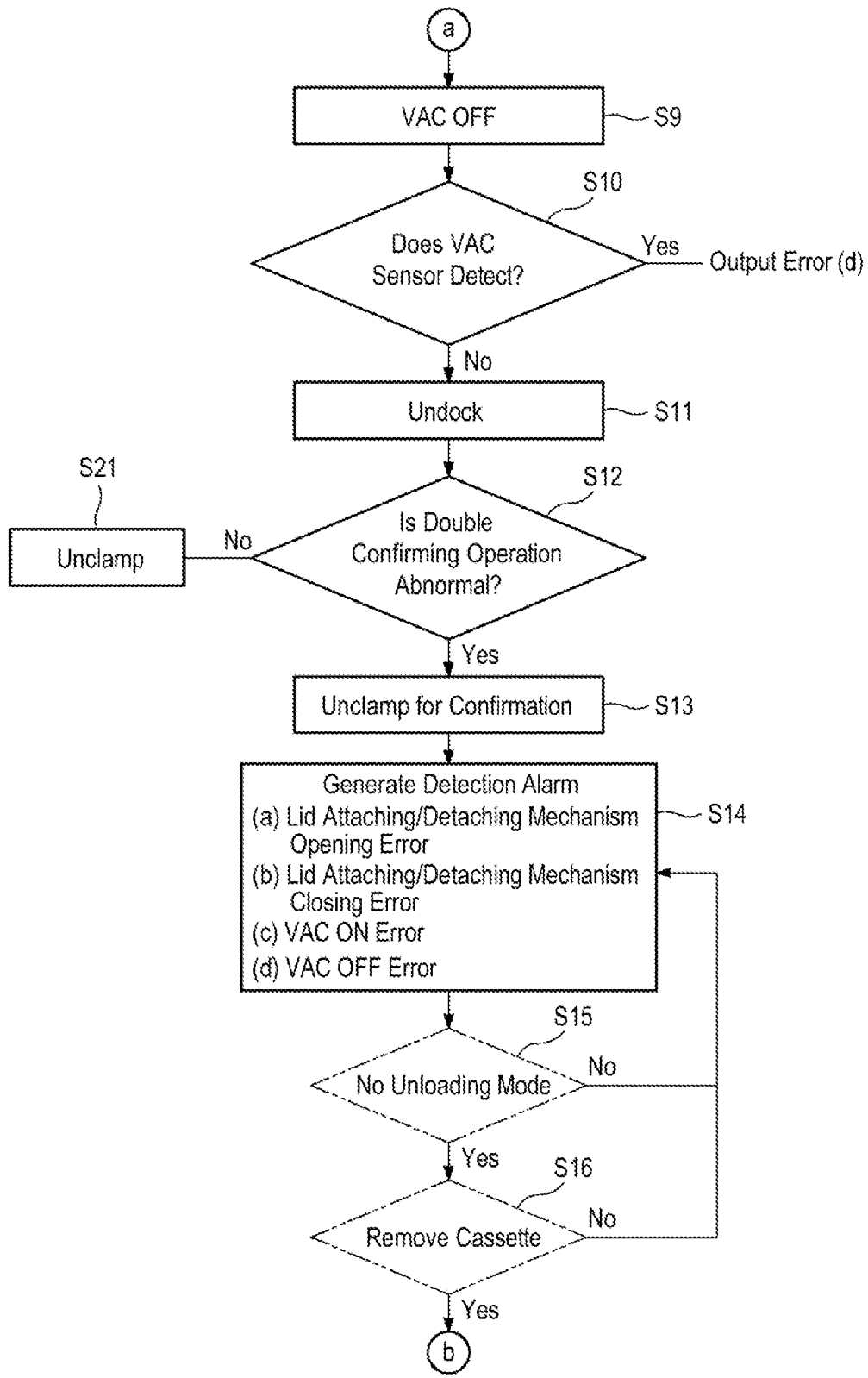
FIG. 9B is a flowchart showing a process from locking the lid to displaying a lid abnormality and removing the cassette in the method of accommodating and processing a substrate of the first embodiment.

As shown in FIGS. 5 to 7, the cassette 10 is provided with a cassette main body 10a, which has the opening 10b allowing wafers W to be charged and discharged therethrough and may accommodate a plurality of (for example 25 sheets) wafers W, and a lid 10c, which is attachable to and detachable from the opening 10b of the cassette main body 10a. In such a case, key holes 10d each having vertical and horizontal holes to allow for communication with each other are respectively formed at left and right locations of a central surface portion of the lid 10c. Latches 10f, which may also be referred to as "Cremornes", may be simultaneously caught in respective catching holes 10e formed at left and right locations of upper and lower opposite opening edges of the opening 10b of the cassette main body 10a and are installed in such a manner to appear and hide at left and right locations of upper and lower ends of the lid 10c. Keys 31 installed on a lid attaching/detaching mechanism 30 described later can respectively be engaged in the key holes 10d, and when the keys 31 are rotated 90 degrees in a vertical direction, the latches 10f located inside the lid 10c simultaneously protrude upward and downward to lock the lid 10c. That is, as shown in FIG. 5, in the lid 10c removed from the opening 10b of the cassette 10, the latches 10f are positioned inside the lid 10c. As shown in FIG. 6, in a state where the lid 10c is engaged with the opening 10b of the cassette 10 and the keys 31 are engaged (fitted) in the key holes 10d, when the keys 31 are rotated 90 degrees, the latches 10f protrude in the up and down direction of the lid 10c and are moved (fitted) into the catching holes 10e formed in the opening 10b of the cassette main body 10a, whereby the lid 10c is closed and locked. In addition, after the latches 10f are retracted from the catching holes 10e and the lid 10c is unlocked by performing the reverse operation to the above, the lid 10c can be removed from the cassette main body 10a.

As shown in FIGS. 4 and 8, the lid attaching/detaching mechanism 30 includes the keys 31 protruding to engage at left and right locations of the central surface portion thereof, and has a shutter plate 33 on which circular pad-shaped suction holding members 32 for suction-holding the lid 10c are installed at upper and lower locations in a diagonal direction. The shutter plate 33 is supported by support members 35 that can be moved up and down by a lifting mechanism 34, for example, including a ball and screw mechanism, a timing belt mechanism, or a cylinder device. In addition, the shutter plate 33 may be configured to move in an installation/removal direction (Y direction) of the lid 10c along linear guides 36 by a Y-axis driving mechanism 37, for example, including a cylinder device.

Also, as shown in FIG. 4, the lid attaching/detaching mechanism 30 is provided with a lid attaching/detaching mechanism closing sensor 38a for detecting a lid closing position, in which the lid 10c suction-held by the suction holding members 32 of the lid attaching/detaching mechanism 30 is engaged at the opening 10b of the cassette 10, and a lid attaching/detaching mechanism opening sensor 38b for detecting a lid opening position, in which the lid 10c is retracted from the lid closing position. The detection signals detected by the lid attaching/detaching mechanism closing sensor 38a and the lid attaching/detaching mechanism opening sensor 38b are sent to the control computer 60.

In addition, the suction holding members 32 are connected through piping 32a to a vacuum pump 32b, which is a negative pressure means for generating a negative pressure for suction. In addition, the piping 32a is provided with a pressure sensor 32c for detecting the negative pressure such as the suction pressure of the suction holding members 32. A detection signal of the pressure sensor 32c is sent to the control computer 60.

In addition, as shown in FIG. 3, the cassette mounting table 11 has four lid accommodating portions 11b installed in parallel in an X-axis direction at the side of the displacement portion 6 of the substrate transfer mechanism 20. The lids 10c removed from the cassettes 10 are accommodated in these lid accommodating portions 11b.

Further, as shown in FIG. 4, upper and lower edges of the opening 13a of the partition wall 13 is provided with protrusion and lid abnormality detecting sensors 39a and 39b, which detect a wafer W protruding from the cassette 10 and simultaneously detect whether or not the lid 10c is securely closed against the opening 10b of the cassette 10. The protrusion and lid abnormality detecting sensors 39a and 39b detect the wafer W protruding from the cassette 10 in order to avoid interference of the lid 10c with the wafer W when the lid 10c retracted from the opening 10b of the cassette 10 is lifted up. Further, as in the apparatus of accommodating and processing a substrate according to the present disclosure described later, in order to confirm a lid closed state of the lid 10c, i.e., whether or not the lid 10c is securely engaged and closed against the opening of the cassette 10, the lid attaching/detaching mechanism 30 is retracted again from the lid closed state until the lid attaching/detaching mechanism opening sensor 38b detects it, and the protrusion and lid abnormality detecting sensors 39a and 39b may detect whether or not the lid 10c is caught in and partially opened (i.e., may confirm an abnormal state of the lid). Detection signals of the abnormal state of the lid detected by the protrusion and lid abnormality detecting sensors 39a and 39b as described above are sent to the control computer 60.

The moving mechanism 14 of the cassette stage 12, the locking and unlocking operation of the keys 31 of the lid attaching/detaching mechanism 30, the lifting mechanism 34, the Y-axis driving mechanism 37 and the vacuum pump 32b, which may be configured as described above, are driven and controlled by a control unit 61 of the control computer 60.

The control unit 61 is installed in the control computer 60. In addition to the control unit 61, a control program storage unit 62 for storing programs for performing respective processing operations (to be described later) performed by the apparatus of accommodating and processing a substrate, a reading unit 63, and a memory unit 64 are also installed in the control computer 60. In addition, the control computer 60 is provided with an input unit 65 connected to the control unit 61, a monitor unit 66 for displaying a processing process screen for preparing the processing operations, a display unit 67 for notifying an abnormal state based on the detection signals of the protrusion and lid abnormality detecting sensors 39a and 39b or the pressure sensor 32c, and a non-transitory computer-readable storage medium 68 configurable to insert and mount onto the reading unit 63 and simultaneously store software for performing the control program on the control computer 60. The control computer 60 is configured to output control signals to the above-described respective components based on the control program.

In addition, the control program may be stored in the storage medium 68, such as a hard disk, a compact disk, a flash memory, a flexible disk, or a memory card, and can be used after being installed on the control computer 60 from the storage medium 68.

Furthermore, the processing portion 2 is surrounded by a housing 50 and, as shown in FIG. 1, shelf units U1 to U4 each having a heating and cooling processing module 40 are stacked in the left side when viewed from the cassette station 1. As shown in FIG. 2, in the right side when viewed from the cassette station 1, a first block (DEV floor) B1 for performing development processing, a second block (BCT floor) B2 for forming an anti-reflective film on a bottom layer side of a resist film, a third block (COT floor) B3 for applying resist liquid, and a fourth block (TCT floor) B4 for forming an anti-reflective film on a top layer side of the resist film are formed to be stacked in this order from below.

Each of the second block (BCT floor) B2 and the fourth block (TCT floor) B4 is provided with a liquid processing module 70 including three coating units for applying a liquid chemical for forming an anti-reflective film by spin coating, a heating and cooling processing module 40 for performing pre-processing and post-processing of the processing performed in the liquid processing module 70, and transfer mechanisms A2 and A4, as substrate transferring means, installed between the liquid processing module 70 and the heating and cooling processing module 40 to receive and deliver a wafer W therebetween (see FIG. 3).

The third block (COT floor) B3 has the same configuration as above except that the liquid chemical is a resist liquid and a hydrophobization processing unit is installed therein. In the first block (DEV floor) B1, for example, developing units are stacked in two stages in the single DEV floor B1. In addition, a common transfer mechanism A1 for transferring a wafer W to the two-staged developing units is installed in the DEV floor B1 (see FIG. 3). In addition, as shown in FIGS. 1 and 3, a shelf unit U5 is installed in the processing portion 2, and a wafer W is transferred between respective sections of the shelf unit U5 by a movable (e.g., lifting) transfer mechanism E installed in the vicinity of the shelf unit U5.

In such a case, two-staged delivery units TCP1 and TRS3 are respectively stacked in a section of the shelf unit U5 opposite to the first block (DEV floor) B1, delivery units CPL2 and BF2 are stacked in two stages in a section of the shelf unit U5 opposite to the second block (BCT floor) B2, delivery units CPL3 and BF3 are stacked in two stages in a section of the shelf unit U5 opposite to the third block (COT floor) B3, and delivery units CPL4 and BF4 are stacked in two stages in a section of the shelf unit U5 opposite to the fourth block (TCT floor) B4 (see FIG. 3).

Furthermore, a shuttle arm F, which is a dedicated transfer means for directly transferring a wafer W from a delivery unit CPL11 installed in the shelf unit U5 to a delivery unit CPL12 installed in a shelf unit U6, is installed in a top portion within the DEV floor B1 (see FIG. 3). The wafer W having a resist film or an anti-reflective film formed thereon is delivered to the delivery unit CPL11 via the delivery unit BF3 or BF4 by the transfer mechanism E, and in the delivery unit CPL11, the wafer W is directly transferred to the delivery unit CPL12 of the shelf unit U6 by the shuttle arm F and then introduced into the interface portion 3.

Then, the wafer W is transferred to the exposure portion 4 by an interface arm G, and after being subjected to predetermined exposure processing in the exposure portion 4, the wafer W is mounted on a delivery unit TRS6 of the shelf unit U6 and returned to the processing portion 2. The returned wafer W is subjected to development processing in the first block (DEV floor) B1 and delivered to the delivery unit TRS3 by the transfer mechanism A1 as a substrate transfer means (see FIG. 3). Thereafter, the wafer W is returned to the cassette 10 via the substrate transfer mechanism 20.

<First Embodiment>

The first embodiment of a method for accommodating and processing a substrate will be described next with reference to FIGS. 9A to 9C and 10.

As described above, based on the control signal(s) from the control unit 61 of the control computer 60, wafers W after being processed are returned to the cassette 10, the lid 10c held and supported by the lid attaching/detaching mechanism 30 is moved to the opening 10b of the cassette 10, and the lid 10c is closed and latched ("Start" in FIG. 9A). In this locked state, the keys 31 and the key holes 10d are in a position in which the keys 31 can be removed from the key holes 10d if any one of the lid attaching/detaching mechanism 30 and the cassette mounting table 11 is retracted (Step S1; see FIG. 10A).

Then, in the locked position of the latch, the lid attaching/detaching mechanism 30 is retracted from the lid closing position to the lid opening position. In this state, if the keys 31 and the key holes 10d do not interfere with each other, the lid attaching/detaching mechanism 30 is retracted in a state where the lid 10c is not held and supported (Step S2; see FIG. 10B).

In this state, the lid attaching/detaching mechanism opening sensor 38b detects the lid opening position that is a retracted position of the lid attaching/detaching mechanism 30, and if the lid attaching/detaching mechanism 30 is not in the lid opening position, an error (lid attaching/detaching mechanism opening error) is output and stored in the memory unit 64 of the control computer 60 (Step S3), after which the flow proceeds to Step S4.

Figure 10A:
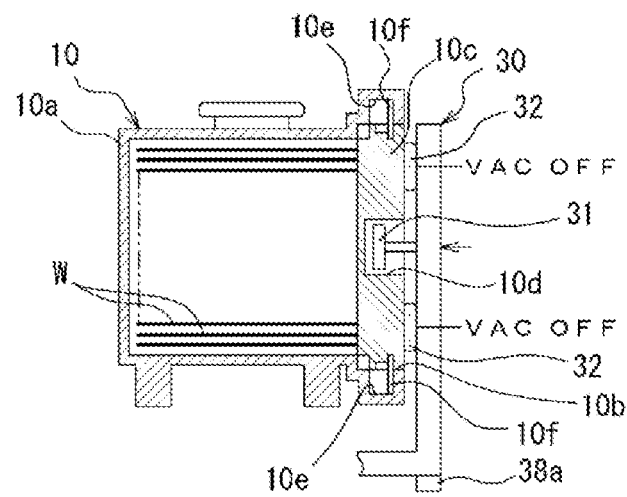
FIG. 10A is a sectional view showing a state before the lid is opened by the lid attaching/detaching mechanism in the method of accommodating and processing a substrate of the first embodiment.
Figure 10B:
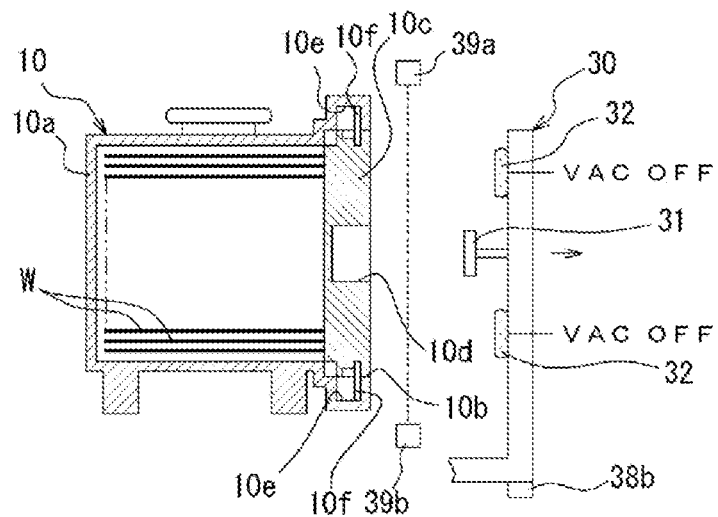
FIG. 10B is a sectional view showing a state where the lid is opened by the lid attaching/detaching mechanism.

After the lid attaching/detaching mechanism opening sensor 38b detects the lid opening position, the protrusion and lid abnormality detecting sensors 39a and 39b detect whether or not there is an abnormality that the closed lid 10c protrudes, i.e., whether or not the lid 10c is securely closed against the cassette 10 (Step S4; see FIG. 10B). By this detection, if the keys 31 and the key holes 10d are not sufficiently engaged with each other and the unlocking and locking is insufficient, for example, if the lid 10c is in a partially open state where the upper latches 10f are removed from the catching holes 10e and the lower latches 10f are not removed from the catching holes 10e, the protrusion and lid abnormality detecting sensors 39a and 39b detect an abnormality of the lid closed state of the lid 10c. As a result, a lid attaching/detaching mechanism closing error is generated to provide an alarm (Step S4-1). This state is notified to an operator, and the operator allows the lid 10c to be held and supported by the lid attaching/detaching mechanism 30 and then performs the lid closing process as the next process again (Step S4-2).

Figure 10C:
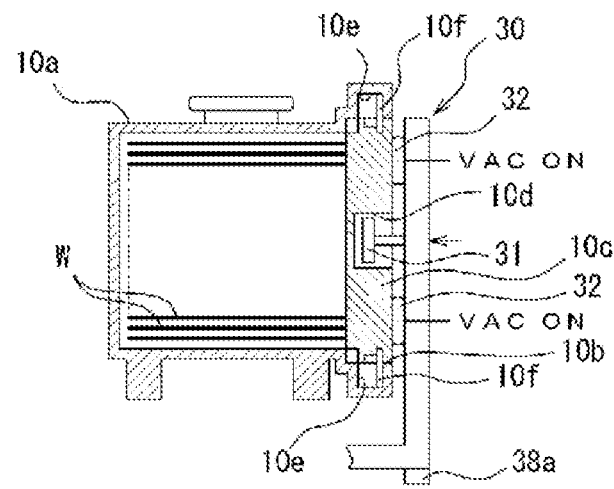
FIG. 10C is a sectional view showing a state where the lid is closed by the lid attaching/detaching mechanism.
Figure 10D:
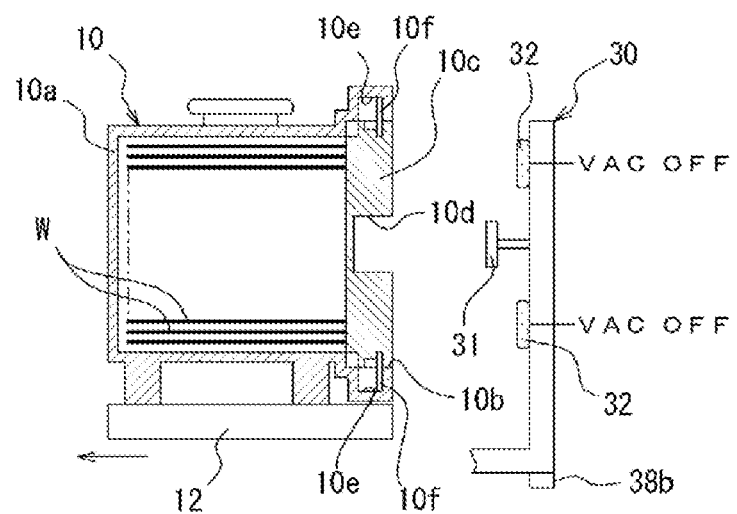
FIG. 10D is a sectional view showing a state after the lid is closed.

Then, the keys 31 are advanced and inserted into the key holes 10d of the lid 10c by moving the lid attaching/detaching mechanism 30 from the lid opening position to the lid closing position (Step S5; see FIG. 10C). Thereafter, the lid attaching/detaching mechanism closing sensor 38a detects the lid closing position of the lid 10c, and if the lid attaching/detaching mechanism 30 is not in the lid closing position, i.e., if the engagement state of the key holes 10d and the keys 31 is not in a predetermined normal state for engagement and the lid attaching/detaching mechanism closing sensor 38a does not detect the lid closing position of the lid 10c, an error (lid attaching/detaching mechanism closing error) is output, which in turn is stored in the memory unit 64 of the control computer 60 (Step S6), after which the flow proceeds to Step S7.

Thereafter, the lid 10c is suction-held and supported by setting the suction holding members 32 to a negative pressure (ON) (Step S7; see FIG. 10C). In this state, the pressure sensor 32c detects the negative pressure in the piping 32a, and if the negative pressure is not suitable for suction-holding the lid 10c, an error (VAC ON error) is output and stored in the memory unit 64 of the control computer 60 (Step S8), after which the flow proceeds to Step S9. Here, the error represents an insufficiently locked state where the vertical hole portions of the key holes 10d are inclined from the vertical locked state to the unlocked direction when the lid attaching/detaching mechanism 30 and the lid 10c are engaged with each other. If the key holes 10d are inclined to the unlocked direction as described above, the latches 10f are not securely fitted into the catching holes 10e, whereby the lid 10c is insufficiently locked and thus may be opened by vibration or the like.

Then, the negative pressure of the suction holding members 32 is released (OFF) (Step S9). In this state, the pressure sensor 32c detects a negative pressure in the piping 32a, and if the negative pressure is not released, an error (VAC OFF error) is output and stored in the memory unit 64 of the control computer 60 (Step S10), after which the flow proceeds to Step S11.

After the negative pressure of the suction holding members 32 is released, the moving mechanism 14 is driven to retract the cassette 10 mounted onto the cassette stage 12 to the undocked position (Step S11).

After the cassette 10 is retracted to the undocked position, it is determined whether or not there is an abnormality in an operation of confirming the cassette 10 (Step S12). When an abnormality is confirmed in the above operation, the cassette 10 clamped to the cassette stage 12 is unclamped for confirmation (Step S13), and a cause for the detection alarm generation stored in the control computer 60 is displayed on the display unit 67 (Step S14). With this indication, it is possible to identify any one of (a) the lid attaching/detaching mechanism opening error, (b) the lid attaching/detaching mechanism closing error, (c) the VAC ON error, and (d) the VAC OFF error.

When the operation is not abnormal, e.g., the lid 10c is securely closed and locked, the cassette 10 is unclamped from the cassette stage 12 (Step S21) and unloaded from the cassette mounting table 11 by the cassette transfer mechanism 5.

Whether there is an unloading mode of the cassette transfer mechanism 5 is confirmed (Step S15), and if there is no unloading mode, the operator removes the cassette 10 from the cassette stage 12 in order to confirm the locking state of the lid 10c (Step S16). After the cassette 10 is removed from the cassette stage 12, a cassette remounting alarm is generated (Step S17).

The operator confirms the cassette 10 (Step S18) and returns the state of the lid 10c to a normal state, thereby mounting the cassette 10 onto the cassette stage 12 again (Step S19). Then, after the alarm is stopped, the process is performed again (Step S20). When the cassette 10 is mounted onto the cassette stage 12, since the lid 10c is securely closed and locked, the cassette 10 is unclamped from the cassette stage 12 (Step S21) and unloaded from the cassette mounting table 11 by the cassette transfer mechanism 5. When the cassette 10 is not remounted onto the cassette stage 12 after the confirmation by the operator, processing for a lost cassette is performed.

The above-described operation of confirming the lid 10c of the cassette 10 is performed based on the control program stored in the storage medium 68. That is, when executed, the control program allows the control computer 60 to control the apparatus of accommodating and processing a substrate so as to perform the following processes: (i) a process of, after the processed wafers W are accommodated in the cassette 10 and the lid 10c is closed against the opening 10b of the cassette 10, moving the lid attaching/detaching mechanism 30 to the lid closing position again and engaging the key holes 10d of the lid 10c and the keys 31 of the lid attaching/detaching mechanism 30 with each other, (ii) a process of detecting the lid opening position of the lid attaching/detaching mechanism 30 by the lid attaching/detaching mechanism opening sensor 38b and of detecting whether or not an abnormality of the lid closing is occurred by the protrusion and lid abnormality detecting sensors 39a and 39b, after the lid attaching/detaching mechanism 30 is retracted from the lid closing position to the lid opening position, thereafter, (iii) a process of detecting the lid closing position of the lid attaching/detaching mechanism 30 by the lid attaching/detaching mechanism closing sensor 38a, after moving the lid attaching/detaching mechanism 30 to the lid closing position for the engagement of the lid, thereafter, (iv) a process of detecting a negative pressure by the pressure sensor 32c, while the lid 10c is suction-held by setting the suction holding members 32 to the negative pressure, thereafter, (v) a process of detecting a negative pressure by the pressure sensor 32c after the negative pressure of the suction holding members 32 is released, and (vi) a process of, after the cassette 10 is retracted to the undocked position, displaying an abnormality indicator of the retracting operation of the lid attaching/detaching mechanism 30 detected by the lid attaching/detaching mechanism opening sensor 38b, an abnormality indicator of the advancing operation of the lid attaching/detaching mechanism 30 detected by the lid attaching/detaching mechanism closing sensor 38a, and whether or not the negative pressure detected by the pressure sensor 32c is suitable.

According to the apparatus (or method) of accommodating and processing a substrate of the first embodiment, by the above-described processes, after the processed wafers W are accommodated in the cassette 10 and the lid 10c is closed against the opening 10b of the cassette 10, after the lid attaching/detaching mechanism 30 is retracted from the lid closing position to the lid opening position again, the lid attaching/detaching mechanism opening sensor 38b may detect the lid opening position of the lid attaching/detaching mechanism 30 and the protrusion and lid abnormality detecting sensors 39a and 39b may detect whether or not there is an abnormality of the lid closed against the cassette 10 and an abnormality of the lid attaching/detaching mechanism 30. In addition, after the lid attaching/detaching mechanism 30 is moved to the lid closing position and the lid attaching/detaching mechanism closing sensor 38a detects the lid closing position of the lid attaching/detaching mechanism 30. Then, the pressure sensor 32c detects a negative pressure while the lid 10c is suction-held by setting the suction holding members 32 to the negative pressure. Then, the pressure sensor 32c detects a negative pressure after the negative pressure of the suction holding members 32 is released. Then, after the cassette 10 is retracted to the undocked position, it is possible to display an abnormality of the lid opening of the lid attaching/detaching mechanism 30 detected by the lid attaching/detaching mechanism opening sensor 38b, an abnormality of the lid closing of the lid attaching/detaching mechanism 30 detected by the lid attaching/detaching mechanism closing sensor 38a, and whether or not the negative pressure detected by the pressure sensor 32c is suitable. Therefore, it is possible to confirm an abnormality of the lid 10c, which cannot be confirmed from the outside by the operator during the operation of closing the lid 10c, and to confirm various other conditions such as whether or not the lid 10c is securely closed, whether or not the lid 10c is securely locked, and the like.

<Second Embodiment>

Next, an apparatus (or method) of accommodating and processing a substrate according to a second embodiment of the present disclosure will be described with reference to FIGS. 11 to 13.

Figure 11:
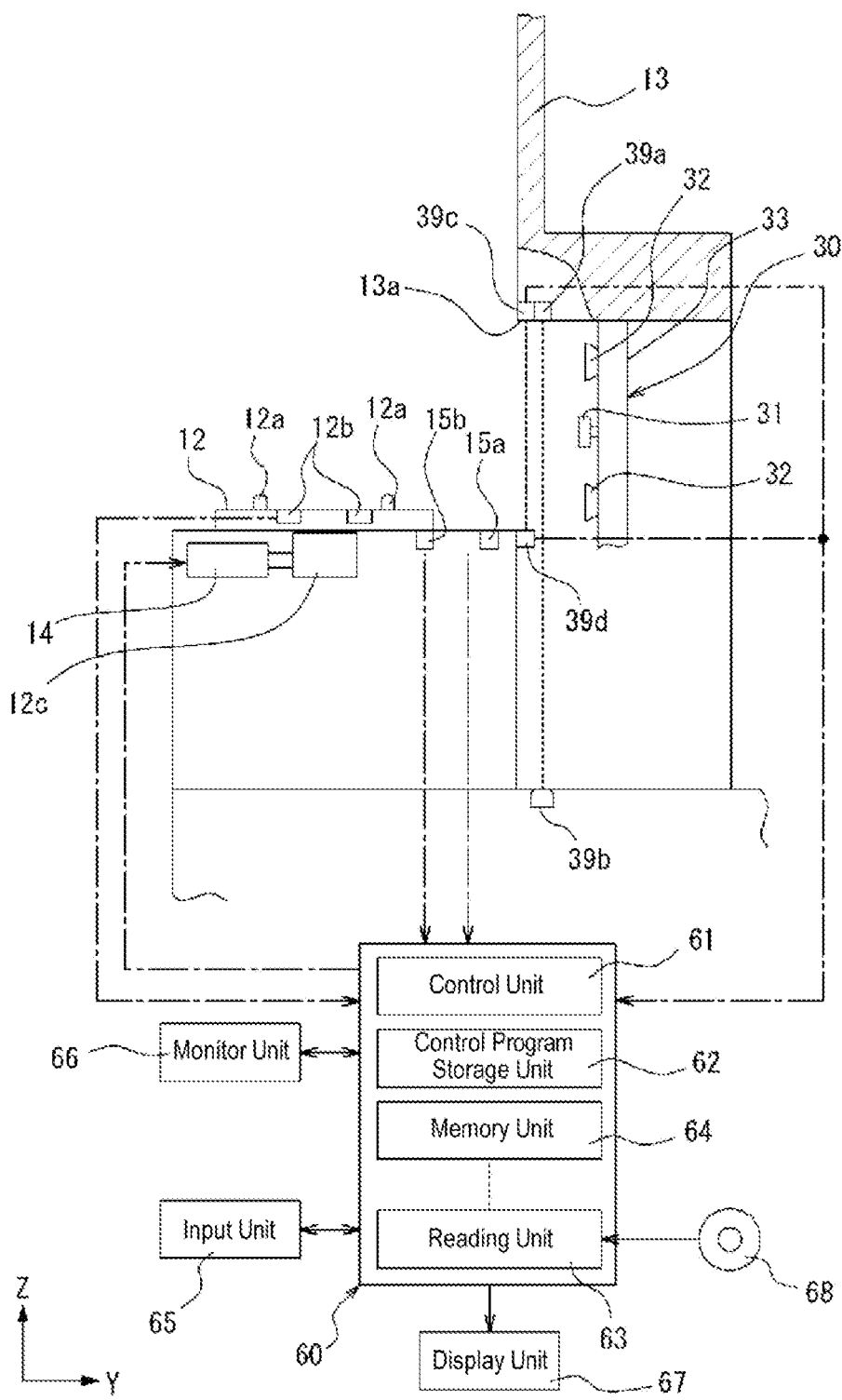
FIG. 11 is a schematic view showing a configuration of a portion of a second embodiment of the apparatus of accommodating and processing a substrate according to the present disclosure.
Figure 12B:
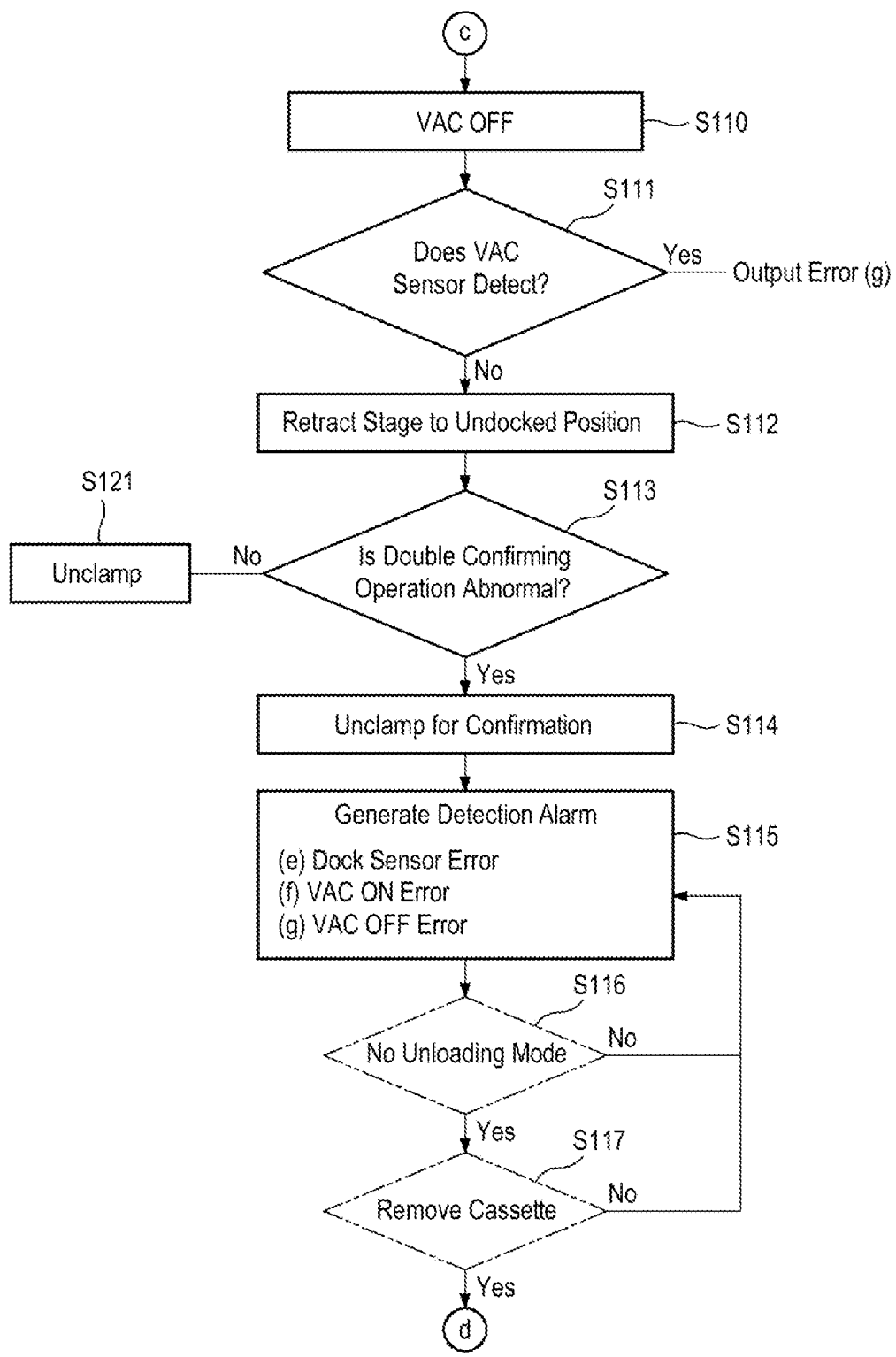
FIG. 12B is a flowchart showing a process until a lid abnormality is displayed and the cassette is removed in the method of accommodating and processing a substrate of the second embodiment.
Figure 12C:
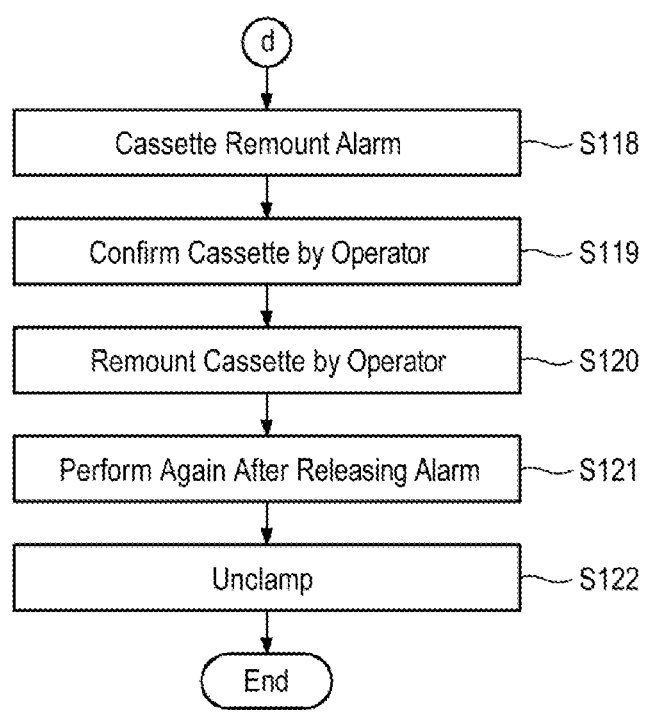
FIG. 12C is a flowchart showing a process after the lid abnormality is confirmed in the method of accommodating and processing a substrate of the second embodiment.

As shown in FIG. 11, the apparatus of accommodating and processing a substrate of the second embodiment is provided with lid abnormality detecting sensors 39c and 39d for confirming an open/closed state of the lid 10c of the cassette 10 at edge portions of the opening 13a of the partition wall 13, a docked position detecting sensor 15a of the cassette stage 12 for detecting a state where the cassette 10 mounted onto the cassette stage 12 is moved to the docked position, and a undocked position detecting sensor 15b of the cassette stage 12 for detecting a state where the cassette 10 is moved to the undocked position.

In the second embodiment, in a state where the cassette 10 transferred by the cassette transfer mechanism 5 is mounted onto the cassette stage 12 of the cassette mounting table 11 and clamped by the clamp mechanism (not shown), the moving mechanism 14 of the cassette stage 12 is driven to move the cassette stage 12 toward the partition wall 13. If the cassette 10 is brought into contact with the opening 13a of the partition wall 13, the docked position detecting sensor 15a detects the docked position, and its detection signal is sent to the control computer 60. Also, in a state where the cassette 10 is moved to the docked position and the key holes 10d in the lid 10c of the cassette 10 and the keys 31 of the lid attaching/detaching mechanism 30 are engaged with each other, the suction holding members 32 are set to a negative pressure (ON) and the negative pressure is detected by the pressure sensor 32c. An engagement state of the lid 10c (i.e., whether the key holes 10d and the keys 31 are securely engaged (fitted into) with each other in the lid closed state (i.e., normal state) or the key holes 10d and the keys 31 are insufficiently engaged with (fitted into) each other (i.e., abnormal state)), is detected, and the detection signal is sent to the control computer 60. In addition, if the moving mechanism 14 of the cassette stage 12 is driven to retract the cassette stage 12 from the partition wall 13 and move it to the undocked position, the undocked position detecting sensor 15b detects the above state and its detection signal is sent to the control computer 60.

In addition, in the second embodiment, since the other elements are the same as the first embodiment, the same reference symbols are given to the same elements and the description thereof will be omitted. Also, when an abnormality of the engagement (fitting) is detected, it is reasonable that the abnormality may be determined based on a docking completion timeout detected by the docked position detecting sensor 15a in a docking completion position, and a combination with the lid abnormality detecting sensors 39c and 39d may also be used.

Next, the operation of a confirming mechanism of the second embodiment of the method of accommodating and processing a substrate according to the present disclosure will be described with reference to FIGS. 12A to 12C and 13.

Figure 13A:
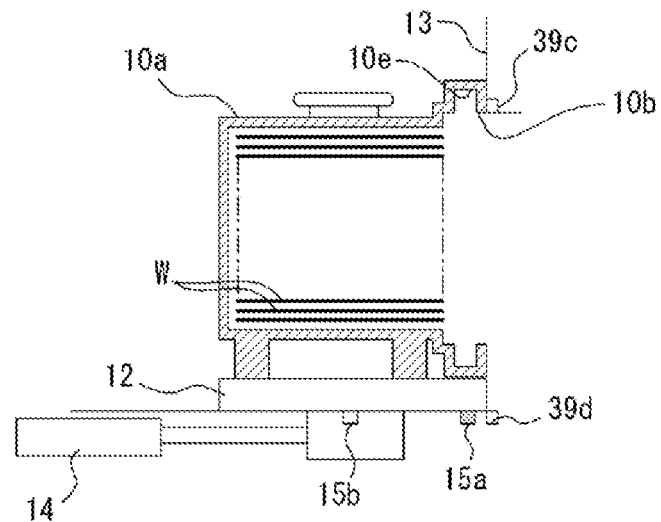
FIG. 13A is a sectional view showing a state of a docked position of the cassette with the lid removed in the method of accommodating and processing a substrate of the second embodiment.
Figure 13B:
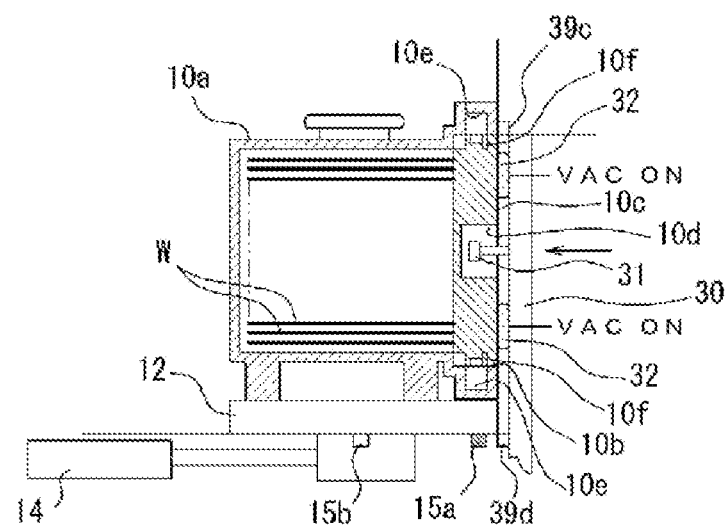
FIG. 13B is a sectional view showing a state where the lid attaching/detaching mechanism is moved to a lid closing position and engages the lid.
Figure 13C:
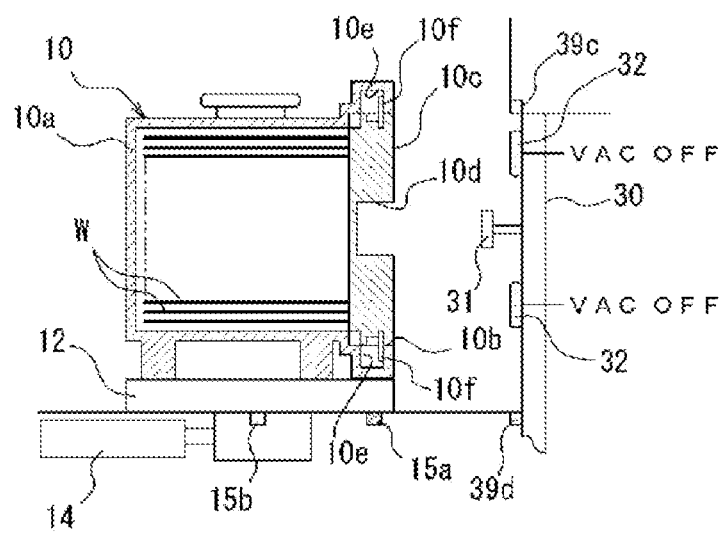
FIG. 13C is a sectional view showing a state where the cassette with the lid engaged thereto is moved to an undocked position.

As described above, after the processed wafers W are accommodated in the cassette 10 located in the docked position, the cassette 10 with the lid 10c removed is allowed to wait in the docked position (Step S101; see FIG. 13A). Then, the Y-axis driving mechanism 37 is driven to engage the lid 10c held and supported by the lid attaching/detaching mechanism 30 to the opening 10b of the cassette 10 (Step S102; see FIG. 13B). In this state, the key holes 10d of the lid 10c and the keys 31 of the lid attaching/detaching mechanism 30 are engaged with each other, thereby locking the lid 10c (Step S103).

Thereafter, the negative pressure of the suction holding members 32 is released (VAC OFF) (Step S104). The moving mechanism 14 is then driven to retract the cassette stage 12 from the docked position and move it to the undocked position (Step S105; see FIG. 13C). The processes up to here are the same as those before the cassette 10 is transferred by the cassette transfer mechanism 5 after the ordinarily processed wafers W are accommodated in the cassette 10 and the lid 10c is engaged and locked.

Figure 13D:
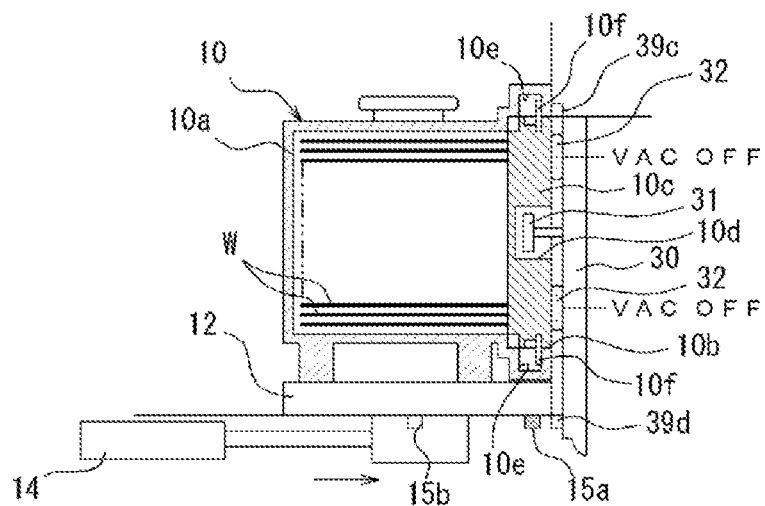
FIG. 13D is a sectional view showing a state of a docked position of the cassette.

Subsequently, the moving mechanism 14 advances the cassette stage 12 from the undocked position toward the partition wall 13 again, thereby moving it to the docked position (Step S106; see FIG. 13D). Then, the key holes 10d of the lid 10c and the keys 31 of the lid attaching/detaching mechanism 30 located in the docked position, i.e., the lid closing position, are engaged with (fitted into) each other. In this state, the docked position detecting sensor 15a detects whether or not the cassette 10 mounted on the cassette stage 12 is in the docked position (Step S107). If the cassette 10 of the cassette stage 12 is not in the docked position, an error (dock sensor error) is output and stored in the memory unit 64 of the control computer 60.

Thereafter, the lid 10c is suction-held by setting the suction holding members 32 to a negative pressure (ON) (Step S108). In this state, the pressure sensor 32c detects the negative pressure in the piping 32a, and if the negative pressure is not suitable for suction-holding the lid 10c, an error (VAC ON error) is output and stored in the memory unit 64 of the control computer 60 (Step S109), after which the flow proceeds to Step S110. Here, the error represents an insufficiently locked state where the vertical hole portions of the key holes 10d are inclined from the vertical locked state to the unlocked direction when the lid attaching/detaching mechanism 30 and the lid 10c are engaged with each other. If the key holes 10d are inclined to the unlocked direction as described above, the latches 10f are not securely fitted into the catching holes 10e, so that the lid 10c is insufficiently locked and thus may be opened by vibration or the like.

Then, the negative pressure of the suction holding members 32 is released (OFF) (Step S110). In this state, the pressure sensor 32c detects a negative pressure in the piping 32a, and if the negative pressure is not released, an error (VAC OFF error) is output and stored in the memory unit 64 of the control computer 60 (Step S111), after which the flow proceeds to Step S112.

After the negative pressure of the suction holding members 32 is released, the moving mechanism 14 is driven to retract the cassette 10 mounted onto the cassette stage 12 to the undocked position (Step S112).

After the cassette 10 is retracted to the undocked position, it is determined whether or not there is an abnormality in an operation of confirming the cassette 10 (Step S113). When there is an abnormality in the above operation, the cassette 10 clamped to the cassette stage 12 is unclamped for confirmation (Step S114), and a cause of the detection alarm generation stored in the control computer 60 is displayed on the display unit 67 (Step S115).

With this display, it is possible to identify any one of (e) the dock sensor error, (f) the VAC ON error, and (g) the VAC OFF error. In addition, (f) the VAC ON error and (g) the VAC OFF error may be confirmed when the error occurs.

When the confirmation operation is not abnormal, since the lid 10c is securely closed and locked, the cassette 10 is unclamped from the cassette stage 12 (Step S122) and unloaded from the cassette mounting table 11 by the cassette transfer mechanism 5.

Whether or not there is an unloading mode of the cassette transfer mechanism 5 is confirmed (Step S116), and if there is no unloading mode, the operator removes the cassette 10 from the cassette stage 12 in order to confirm the locking state of the lid 10c (Step S117). After the cassette 10 is removed from the cassette stage 12, a cassette remounting alarm is generated (Step S118).

The operator confirms the cassette 10 (Step S119) and returns the state of the lid 10c to a normal state, thereby mounting the cassette 10 onto the cassette stage 12 again (Step S120). Then, after the alarm is stopped, the process is performed again (Step S121). When the cassette 10 is mounted onto the cassette stage 12, since the lid 10c is securely closed and locked, the cassette 10 is unclamped from the cassette stage 12 (Step S122) and unloaded from the cassette mounting table 11 by the cassette transfer mechanism 5. When the cassette 10 is not remounted onto the cassette stage 12 after the confirmation by the operator, processing for a lost cassette is performed.

The above-described operation of double confirming the lid 10c of the cassette 10 is performed based on the control program stored in the storage medium 68. That is, when executed, the control program allows the control computer 60 to control the apparatus of accommodating and processing a substrate so as to perform the following processes: (i) a process of allowing the cassette 10, which has the processed wafers W accommodated therein and the lid 10c removed therefrom, to wait in the docked position, (ii) a process of engaging and locking the lid 10c held and supported by the lid attaching/detaching mechanism 30 to the opening 10b of the cassette 10, (iii) a process of moving the cassette 10 with the lid 10c locked (closed) thereto to the undocked position, (iv) a process of detecting an abnormality of the lid 10c by the lid abnormality detecting sensors 39c and 39d in a state where the key holes 10d of the lid 10c and the keys 31 of the lid attaching/detaching mechanism 30 are engaged with each other by moving the cassette 10 to the docked position again, (v) a process of detecting whether or not the cassette 10 is in the docked position by the docked position detecting sensor 15a of the cassette stage 12 in a state where the cassette 10 is moved to the docked position, (vi) a process of detecting a negative pressure by the pressure sensor 32c while the lid 10c is suction-held by setting the suction holding members 32 to the negative pressure, thereafter, (vii) a process of detecting a negative pressure by the pressure sensor 32c in a state where the negative pressure of the suction holding members 32 is released, (viii) a process of displaying an abnormality of the lid 10c detected by the lid abnormality detecting sensors 39c and 39d and whether or not the cassette 10 is in the docked position detected by the docked position detecting sensor 15a after the cassette 10 is retracted to the undocked position, and (ix) a process of displaying whether or not the negative pressure detected by the pressure sensor 32c is suitable.

According to the apparatus (or method) of accommodating and processing a substrate of the second embodiment, by the above-described processes, the processed wafers W are accommodated in the cassette 10 and the lid 10c held and supported by the lid attaching/detaching mechanism 30 is engaged and locked to the opening 10b of the cassette 10 and the cassette 10 is moved to the undocked position. Then the cassette 10 is moved to the docked position again and the key holes 10d of the lid 10c and the keys 31 of the lid attaching/detaching mechanism 30 are engaged with each other. Then, the suction holding members 32 are set to a negative pressure (ON). At this moment, the negative pressure is detected by the pressure sensor 32c, while an abnormality of the installation state of the lid 10c is detected. The docked position detecting sensor 15a of the cassette stage 12 detects whether or not the cassette 10 is in the docked position while the cassette 10 is moved to the docked position. After the cassette 10 is retracted to the undocked position, an abnormality of the installation state of the lid 10c is detected by the pressure sensor 32c, and whether or not the cassette 10 is in the docked position detected by the docked position detecting sensor may be displayed. In addition, in a state where the cassette 10 is moved to the docked position and is in the lid closing position, the pressure sensor 32c detects a negative pressure in a state where the lid 10c is suction-held by setting the suction holding members 32 to the negative pressure, and then, the pressure sensor 32c detects a negative pressure in a state where the negative pressure of the suction holding members 32 is released. Then, after the cassette 10 is retracted to the undocked position, whether or not the negative pressure detected by the pressure sensor 32c is suitable may be displayed.

Therefore, it is possible to confirm an abnormality of the lid 10c, which cannot be confirmed from the outside by the operator during the operation of closing the lid 10c, and to confirm whether or not the lid 10c is securely closed, whether or not the lid 10c is securely locked, and the like.

Further, in the second embodiment, although whether or not the negative pressure detected by the pressure sensor 32c is suitable is displayed after the cassette 10 is moved to the undocked position, it may be displayed whenever the pressure sensor 32c detects the negative pressure.

<Other Embodiments>

The first embodiment may have a process of unlocking and relocking the lid 10c after the key holes 10d of the lid 10c and the keys 31 of the lid attaching/detaching mechanism 30 are engaged with each other and before the lid 10c is retracted to the lid opening position. This makes it possible to securely lock the lid 10c.

In the second embodiment, although in a state where the cassette 10 is moved to the docked position, the suction holding members 32 are set to a negative pressure (ON) and the negative pressure is detected by the pressure sensor 32c to detect an abnormality of an installation state of the lid 10c and simultaneously the docked position detecting sensor 15a of the cassette stage 12 detects whether or not the cassette 10 is in the docked position, it is possible to double confirm the locking (closing) of the lid 10c only by detecting an abnormality of the lid 10c by the pressure sensor 32c.

In the above-described embodiments, while it has been described that the apparatus (or method or storage medium) of accommodating and processing a substrate of the present disclosure is used in the processing system of the coating and development processing apparatus of a wafer W, the present disclosure is not limited thereto and may be applied to a transfer processing system of a substrate other than the wafer W, which is to transfer a lid-installed cassette accommodating the substrate.

According to the present disclosure, it is possible to confirm an abnormality due to operation troubles or the like caused from aging deterioration of a lid opening/closing mechanism of a cassette, whether or not a lid is securely closed, whether or not a lid is securely locked, thereby being capable of determining the cassette having a lid closing abnormality due to the locking of the lid. Therefore, since only a cassette having a lid normally locked except the abnormal cassette may be transferred by the cassette transfer mechanism, it is possible to promote the safe transfer of a processed substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate accommodating and processing apparatus, comprising:
    a cassette mounting table configured to mount a cassette having an opening for charging and discharging a substrate therethrough and a lid attachable to and detachable from the opening;
    a processing part configured to process the substrate accommodated in the cassette of the cassette mounting table;
    a substrate transfer mechanism configured to transfer the substrate to the processing part and to return the substrate after being processed to the cassette of the cassette mounting table;
    a partition wall configured to divide the cassette mounting table and a displacement part of the substrate transfer mechanism from each other and to have an opening larger than the opening of the cassette;
    a cassette stage configured to be displaced on the cassette mounting table and to be movable forward and rearward to a docked position causing the mounted cassette to be in contact with the opening of the partition wall and an undocked position retracted from the docked position;
    a lid attaching/detaching mechanism configured to remove the lid from the opening of the cassette and engage the lid to the opening of the cassette via the opening of the partition wall,
    wherein the lid attaching/detaching mechanism is provided with a key configured to be engaged with a key hole installed in the lid, and configured to switch a latch between locking and unlocking positions, the latch being removed from or caught into the opening of the cassette, and a suction holding member configured to suction-hold and support the lid;
    a lid abnormality detecting sensor displaced at an edge of the opening of the partition wall to confirm an open/closed state of the lid;
    a lid attaching/detaching mechanism closing sensor and a lid attaching/detaching mechanism opening sensor respectively configured to detect a lid closing position in which the lid held and supported by the lid attaching/detaching mechanism is engaged and a lid opening position retracted from the lid closing position;
    a pressure sensor configured to detect a negative pressure allowing the suction holding member to suction-hold and support the lid; and
    a control part configured to receive detection signals of the lid abnormality detecting sensor, the lid attaching/detaching mechanism closing sensor, the lid attaching/detaching mechanism opening sensor and the pressure sensor and to control operation of moving the lid attaching/detaching mechanism to opening and closing positions, operation of locking and unlocking the key, and operation of moving the cassette mounted onto the cassette stage to the docked position and the undocked position,
    wherein based on a control signal of the control part, after the processed substrate is accommodated in the cassette and the lid is closed against the opening of the cassette, when the lid attaching/detaching mechanism with the lid not held and supported is retracted from the lid closing position to the lid opening position, the lid attaching/detaching mechanism opening sensor detects the lid opening position of the lid and the lid abnormality detecting sensor detects whether or not there is a lid abnormality to determine an abnormality of the lid closed state.

2. The apparatus of claim 1, wherein after the lid abnormality detecting sensor detects whether or not there is a lid abnormality, in a state where the lid is closed against the opening of the cassette, the lid attaching/detaching mechanism is moved to the lid closing position, the key hole of the lid and the key of the lid attaching/detaching mechanism are engaged with each other, the lid attaching/detaching mechanism closing sensor detects the lid closing position of the lid attaching/detaching mechanism, thereafter, the pressure sensor detects a predetermined negative pressure in a state where the lid is suction-held and supported by setting the suction holding member to the negative pressure, the pressure sensor detects a negative pressure in a state where the negative pressure of the suction holding member is released, and after the cassette is retracted to the undocked position, if there is an abnormality of the lid closing of the cassette, at least one of an abnormality of the lid opening detected by the lid attaching/detaching mechanism opening sensor, an abnormality of the lid closing detected by the lid attaching/detaching mechanism closing sensor, and whether or not the negative pressure detected by the pressure sensor is suitable is displayed.

3. The apparatus of claim 2, wherein after the key hole of the lid and the key of the lid attaching/detaching mechanism are engaged with each other and before the lid attaching/detaching mechanism is retracted to the lid opening position, the lid is unlocked and then relocked.

4. A method of accommodating and processing a substrate using an apparatus of accommodating and processing a substrate, the apparatus including:
a cassette mounting table configured to mount a cassette having an opening for charging and discharging a substrate therethrough and a lid attachable to and detachable from the opening;
a processing part configured to process the substrate accommodated in the cassette of the cassette mounting table;
a substrate transfer mechanism configured to transfer the substrate to the processing part and to return the substrate after being processed to the cassette of the cassette mounting table;
a partition wall configured to divide the cassette mounting table and a displacement part of the substrate transfer mechanism from each other and to have an opening larger than the opening of the cassette;
a cassette stage configured to be displaced on the cassette mounting table and to be movable forward and rearward to a docked position causing the mounted cassette to be in contact with the opening of the partition wall and an undocked position retracted from the docked position;
a lid attaching/detaching mechanism configured to remove the lid from the opening of the cassette and engage the lid to the opening of the cassette via the opening of the partition wall,
wherein the lid attaching/detaching mechanism is provided with a key configured to be engaged with a key hole installed in the lid, the key switching a latch between locking and unlocking positions, the latch being removable caught in the opening of the cassette, and a suction holding member configured to suction-hold and support the lid,
a lid abnormality detecting sensor displaced at an edge of the opening of the partition wall to confirm an open/closed state of the lid;
a lid attaching/detaching mechanism closing sensor and a lid attaching/detaching mechanism opening sensor respectively configured to detect a lid closing position in which the lid held and supported by the lid attaching/detaching mechanism is engaged and a lid opening position retracted from the lid closing position;
a pressure sensor configured to detect a negative pressure allowing the suction holding member to suction-hold and support the lid; and
a control part configured to receive detection signals from the lid abnormality detecting sensor, the lid attaching/detaching mechanism closing sensor, the lid attaching/detaching mechanism opening sensor and the pressure sensor and to control operation of moving the lid attaching/detaching mechanism to opening and closing positions, operation of locking and unlocking the key, and operation of moving the cassette mounted onto the cassette stage to the docked position and the undocked position,
the method comprising:
closing the lid against the opening of the cassette after the processed substrate is accommodated in the cassette;
retracting the lid attaching/detaching mechanism from the lid closing position to the lid opening position in a state where the lid is not held and supported;
detecting the lid opening position of the lid attaching/detaching mechanism by the lid attaching/detaching mechanism opening sensor;
determining an abnormality of a closing state of the lid by the lid abnormality detecting sensor;
moving the lid attaching/detaching mechanism retracted from the lid closing position to the lid closing position again; and
engaging the key hole of the lid and the key of the lid attaching/detaching mechanism with each other.

5. The method of claim 4, further comprising:
detecting whether or not there is a lid abnormality by the lid abnormality detecting sensor, and then, moving the lid attaching/detaching mechanism to the lid closing position and engaging the key hole of the lid and the key of the lid attaching/detaching mechanism with each other;
detecting the lid closing position of the lid attaching/detaching mechanism by the lid attaching/detaching mechanism closing sensor;
detecting a predetermined negative pressure by the pressure sensor in a state where the lid is suction-held and supported by setting the suction holding member to the negative pressure;
detecting a negative pressure by the pressure sensor in a state where the negative pressure of the suction holding member is released; and
displaying at least one of an abnormality of the lid opening detected by the lid attaching/detaching mechanism opening sensor, an abnormality of the lid closing detected by the lid attaching/detaching mechanism closing sensor, and whether or not the negative pressure detected by the pressure sensor is suitable, if there is an abnormality of the lid closing of the cassette after the cassette is retracted to the undocked position.

6. The method of claim 5, further comprising unlocking and then relocking the lid between the engaging the key hole of the lid and the key of the lid attaching/detaching mechanism with each other and the retracting the lid attaching/detaching mechanism to the lid opening position.

7. A method of accommodating and processing a substrate using an apparatus of accommodating and processing a substrate, the apparatus including:
a cassette mounting table configured to mount a cassette having an opening for charging and discharging a substrate therethrough and a lid attachable to and detachable from the opening;

a processing part configured to process the substrate accommodated in the cassette of the cassette mounting table;

a substrate transfer mechanism configured to transfer the substrate to the processing part and to return the substrate after being processed to the cassette of the cassette mounting table;

a partition wall configured to divide the cassette mounting table and a displacement part of the substrate transfer mechanism from each other and to have an opening larger than the opening of the cassette;

a cassette stage configured to be displaced on the cassette mounting table and to be movable forward and rearward to a docked position causing the mounted cassette to be in contact with the opening of the partition wall and an undocked position retracted from the docked position;

a docked position detecting sensor configured to detect the docked position of the cassette mounted onto the cassette stage;

a lid attaching/detaching mechanism configured to remove the lid from the opening of the cassette and engage the lid to the opening of the cassette via the opening of the partition wall, wherein the lid attaching/detaching mechanism is provided with a key configured to be engaged with a key hole installed in the lid, the key switching a latch between locking and unlocking positions, the latch being removable caught in the opening of the cassette, and a suction holding member configured to suction-hold and support the lid, and a control part configured to control operation of moving the lid attaching/detaching mechanism to opening and closing positions, operation of locking and unlocking the key, and operation of moving the cassette mounted onto the cassette stage to the docked position and the undocked position, the method comprising:

engaging the key hole of the lid and the key of the lid attaching/detaching mechanism with each other in a state where the cassette is retracted to the undocked position and then moved to the docked position again after the processed substrate is accommodated in the cassette and the lid is closed against the opening of the cassette, based on a control signal from the control part; and confirming whether or not there is a signal from the docked position detecting sensor for detecting the docked position in the engaging the key hole of the lid and the key of the lid attaching/detaching mechanism with each other.

8. The method of claim 7, further comprising displaying whether or not the cassette is in the docked position detected by the docked position detecting sensor after the cassette stage is retracted to the undocked position, if there is no signal of the docked position sensor when the cassette remounted onto the cassette stage is advanced to the docked position.

9. The method of claim 8, further comprising detecting a negative pressure by a pressure sensor in a state where the lid is suction-held and supported by setting the suction holding member to the negative pressure, based on a control signal from the control part receiving a detection signal from the pressure sensor for detecting the negative pressure allowing the suction holding member to suction-hold and support the lid;

detecting a negative pressure by the pressure sensor in a state where the negative pressure of the suction holding member is released; and displaying whether or not the negative pressure detected by the pressure sensor is suitable.

10. The method of claim 7, further comprising detecting a negative pressure by a pressure sensor in a state where the lid is suction-held and supported by setting the suction holding member to the negative pressure, based on a control signal from the control part receiving a detection signal from the pressure sensor for detecting the negative pressure allowing the suction holding member to suction-hold and support the lid;

detecting a negative pressure by the pressure sensor in a state where the negative pressure of the suction holding member is released; and displaying whether or not the negative pressure detected by the pressure sensor is suitable.

* * * * *